(12) United States Patent
Deguchi

(10) Patent No.: US 8,846,495 B2
(45) Date of Patent: Sep. 30, 2014

(54) BONDING SYSTEM AND BONDING METHOD

(71) Applicant: Tokyo Electron Limited, Tokyo (JP)

(72) Inventor: Masatoshi Deguchi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/893,630

(22) Filed: May 14, 2013

(65) Prior Publication Data

US 2013/0316516 A1  Nov. 28, 2013

(30) Foreign Application Priority Data

May 28, 2012  (JP) ................. 2012-121188

(51) Int. Cl.
| | | |
|---|---|---|
| *H01L 21/30* | (2006.01) | |
| *H01L 21/46* | (2006.01) | |
| *H01L 29/04* | (2006.01) | |
| *H01L 27/108* | (2006.01) | |
| *H01L 29/94* | (2006.01) | |
| *H01L 21/67* | (2006.01) | |
| *H01L 21/677* | (2006.01) | |
| *H01L 21/18* | (2006.01) | |

(52) U.S. Cl.
CPC ...... *H01L 21/67121* (2013.01); *H01L 21/6715* (2013.01); *H01L 21/67092* (2013.01); *H01L 21/67051* (2013.01); *H01L 21/67109* (2013.01); *H01L 21/67742* (2013.01); *H01L 21/67178* (2013.01); *H01L 21/185* (2013.01)
USPC ............. 438/455; 257/58; 257/300; 257/305

(58) Field of Classification Search
USPC ................ 438/455–459; 118/58–69, 300
See application file for complete search history.

(56) References Cited

U.S. PATENT DOCUMENTS

| | | | | |
|---|---|---|---|---|
| 2005/0000636 | A1* | 1/2005 | Geiger et al. ............... | 156/247 |
| 2005/0221598 | A1* | 10/2005 | Lu et al. .................... | 438/613 |
| 2009/0218560 | A1* | 9/2009 | Flaim et al. ................ | 257/9 |
| 2011/0014774 | A1* | 1/2011 | Johnson et al. ............ | 438/455 |

FOREIGN PATENT DOCUMENTS

JP   2008-182016 A   8/2008

OTHER PUBLICATIONS

Material Data Sheet for SemicoSil 912 by Wacker Chemie AG.*
Material Data Sheet for WaferBOND HT-10.10 by Brewer Science.*

* cited by examiner

*Primary Examiner* — Karen Kusumakar
(74) *Attorney, Agent, or Firm* — Abelman, Frayne & Schwab

(57) ABSTRACT

Disclosed is a bonding system which efficiently performs a bonding of a substrate to a support substrate, thereby improving the throughput in a bonding processing. The disclosed bonding system includes a loading/unloading station and a processing station. The processing station includes: an adhesive applying device configured to apply an adhesive to the wafer; a protective agent applying device configured to apply a protective agent to the wafer, a remover applying device configured to apply a remover to the support wafer, a heat processing device configured to heat the wafer or the support wafer which is applied with at least the adhesive, the protective agent or the remover, at a predetermined temperature, a bonding device configured to bond the wafer to the support wafer through the adhesive, the protective agent and the remover, and a wafer transfer area configured to transfer the wafer, the support wafer or the bonded wafer.

18 Claims, 38 Drawing Sheets

US 8,846,495 B2

BONDING SYSTEM AND BONDING METHOD

CROSS-REFERENCE TO RELATED APPLICATIONS

This application is based on and claims priority from Japanese Patent Application No. 2012-121188, filed on May 28, 2012, with the Japan Patent Office, the disclosure of which is incorporated herein in its entirety by reference.

TECHNICAL FIELD

The present disclosure relates to a bonding system of bonding a substrate to be processed ("substrate") to a support substrate, and a method, a program, or a computer storage medium of bonding the substrate to the support substrate using the bonding system.

BACKGROUND

In a process of fabricating, for example, a semiconductor device, the diameter of a semiconductor wafer to be processed ("wafer") has been increased recently. Also, in a specific process such as a mounting process, a wafer is required to become thinner. For example, when a thin wafer having a large diameter is transferred as it is or when the thin wafer is subjected to a polishing processing, there is a possibility that a flexure or a crack may occur in the wafer. For this reason, for example, in order to reinforce the wafer, a process of bonding the wafer to, for example, another wafer or a glass substrate serving as a support substrate, is carried out.

Such bonding of the wafer to the support substrate is performed by disposing an adhesive between the wafer and the support substrate through, for example, a bonding apparatus. The bonding apparatus, for example, has a first holding member configured to hold the wafer, a second holding member configured to hold the support substrate, a heating mechanism configured to heat the adhesive disposed between the wafer and the support substrate, and a moving mechanism configured to move at least the first holding member or the second holding member in the upper and lower directions. Also, in the bonding apparatus, the adhesive is supplied between the wafer and the support substrate, and is heated, and then the wafer and the support substrate are bonded together by being compressed. See, e.g., Japanese Patent Application Laid-Open No. 2008-182016.

SUMMARY

The present disclosure provides a bonding system configured to bond a substrate to a support substrate, including a processing station configured to perform a series of predetermined processing on the substrate and the support substrate; and a loading/unloading station configured to load or unload the substrate, the support substrate, or a bonded substrate including the substrate bonded to the support substrate to/from the processing station. In particular, the processing station includes an adhesive supply part configured to apply an adhesive to the substrate or the support substrate; a protective agent supply part configured to apply a protective agent having a lower viscosity than the adhesive to the substrate so that the protective agent is applied to the side of the substrate rather than to the adhesive, between the substrate and the support substrate; a remover supply part configured to apply a remover having a lower viscosity than the adhesive to the substrate or the support substrate so that the remover is applied to the side of the support substrate rather than to the adhesive, between the substrate and the support substrate; a heat processing device configured to heat the substrate or the support substrate which is applied with at least the adhesive, the protective agent or the remover, at a predetermined temperature; a bonding device configured to bond the substrate to the support substrate through the adhesive, the protective agent and the remover; and a transfer area configured to transfer the substrate, the support substrate or the bonded substrate to/from the adhesive supply part, the protective agent supply part, the remover supply part, the heat processing device and the bonding device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
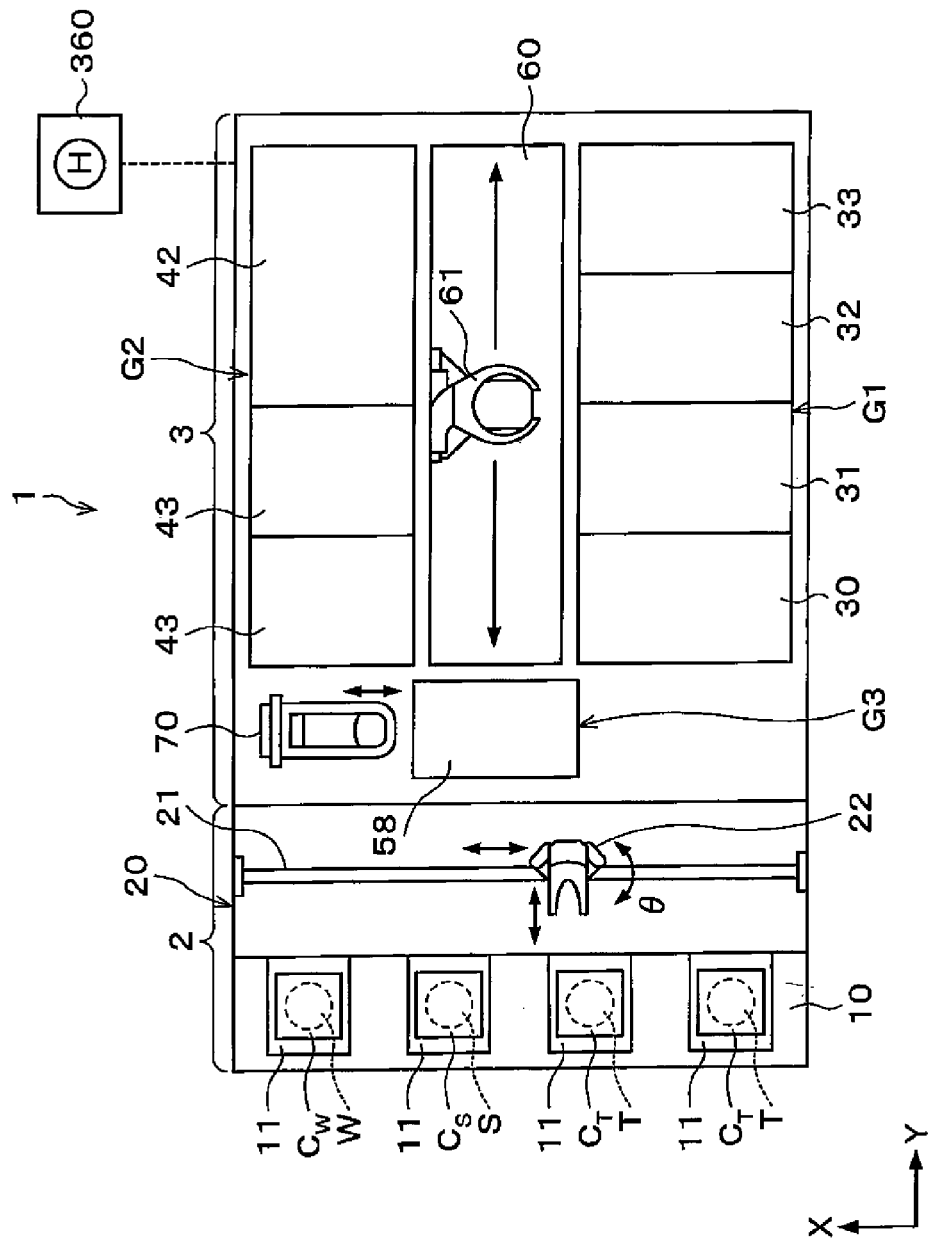
FIG. 1 is a plan view schematically illustrating the configuration of a bonding system according to the present exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When a bonding device disclosed in Japanese Patent Application Laid-Open No. 2008-182016 is used, all of the processing such as adhesive supply, heating, and pressure on a wafer and a support substrate are performed within one bonding device. Thus, the bonding of the wafer to the support substrate requires a relatively long time. Therefore, there is room for improvement in the entire throughput of a bonding processing.

Also, the wafer is released from the support substrate after a predetermined processing such as a polishing processing on the wafer is performed in a state where the wafer and the support substrate are bonded to each other. Here, there is a case where a remover may be supplied to the side of the support substrate rather than to an adhesive, between the wafer and the support substrate, in order to smoothly release the wafer from the support substrate. However, in the above-described bonding device disclosed in Japanese Patent Application Laid-Open No. 2008-182016, the supply of such a remover is not considered at all. In this regard, there is room for improvement in the entire throughput of a bonding processing.

The present disclosure has been made by taking these factors into consideration and an object of the present disclosure is to efficiently perform a bonding of a substrate to a support substrate, thereby improving the throughput in a bonding processing.

The present disclosure provides a bonding system configured to bond a substrate to a support substrate, including a processing station configured to perform a series of predetermined processing on the substrate and the support substrate; and a loading/unloading station configured to load or unload the substrate, the support substrate, or a bonded substrate including the substrate bonded to the support substrate to/from the processing station. In particular, the processing station includes an adhesive supply part configured to apply an adhesive to the substrate or the support substrate; a protective agent supply part configured to apply a protective agent having a lower viscosity than the adhesive to the substrate so that the protective agent is applied to the side of the substrate rather than to the adhesive, between the substrate and the support substrate; a remover supply part configured to apply a remover having a lower viscosity than the adhesive to the substrate or the support substrate so that the remover is applied to the side of the support substrate rather than to the adhesive, between the substrate and the support substrate, a heat processing device configured to heat the substrate or the support substrate which is applied with at least the adhesive, the protective agent or the remover, at a predetermined temperature; a bonding device configured to bond the substrate to the support substrate through the adhesive, the protective agent and the remover; and a transfer area configured to transfer the substrate, the support substrate or the bonded substrate to/from the adhesive supply part, the protective agent supply part, the remover supply part, the heat processing device and the bonding device.

In another aspect, the present disclosure provides a bonding system configured to bond a substrate to a support substrate, including a processing station configured to perform a series of predetermined processing on the substrate and the support substrate; and a loading/unloading station configured to load or unload the substrate, the support substrate, or a bonded substrate including the substrate bonded to the support substrate, to/from the processing station. In particular, the processing station includes an adhesive supply part configured to apply an adhesive to the substrate or the support substrate; a remover supply part configured to apply a remover having a lower viscosity than the adhesive to the substrate or the support substrate so that the remover is applied to the side of the support substrate rather than to the adhesive, between the substrate and the support substrate; a heat processing device configured to heat the substrate or the support substrate which is applied with at least the adhesive, or the remover, at a predetermined temperature, a bonding device configured to bond the substrate to the support substrate through the adhesive, and the remover; and a transfer area configured to transfer the substrate, the support substrate or the bonded substrate to/from the adhesive supply part, the remover supply part, the heat processing device and the bonding device.

In a further aspect, the present disclosure provides a method of bonding a substrate to a support substrate by using a bonding system. In particular, the bonding system includes a processing station and a loading/unloading station configured to load or unload the substrate, the support substrate, or a bonded substrate including the substrate bonded to the support substrate to/from the processing station. The processing station includes an adhesive supply part configured to apply an adhesive to the substrate or the support substrate; a remover supply part configured to apply a remover having a lower viscosity than the adhesive to the substrate or the support substrate so that the remover is applied to the side of the support substrate rather than to the adhesive, between the substrate and the support substrate; a heat processing device configured to heat the substrate or the support substrate which is applied with at least the adhesive or the remover at a predetermined temperature; a bonding device configured to bond the substrate to the support substrate through the adhesive and the remover, and a transfer area configured to transfer the substrate, the support substrate or the bonded substrate to/from the adhesive supply part, the remover supply part, the heat processing device and the bonding device. The method includes: an adhesive applying step of applying the adhesive from the adhesive supply part to the substrate or the support substrate; and heating the substrate or the support substrate to a predetermined temperature by the heat processing device; a remover applying step of applying the remover from the remover supply part to the substrate or the support substrate; and heating the substrate or the support substrate to a predetermined temperature by the heat processing device, and a bonding step of bonding the substrate to the support substrate through the adhesive and the remover in the bonding device.

According to the present disclosure, a bonding of the substrate to the support substrate may be efficiently performed, thereby improving the throughput in a bonding processing.

Figure 2:
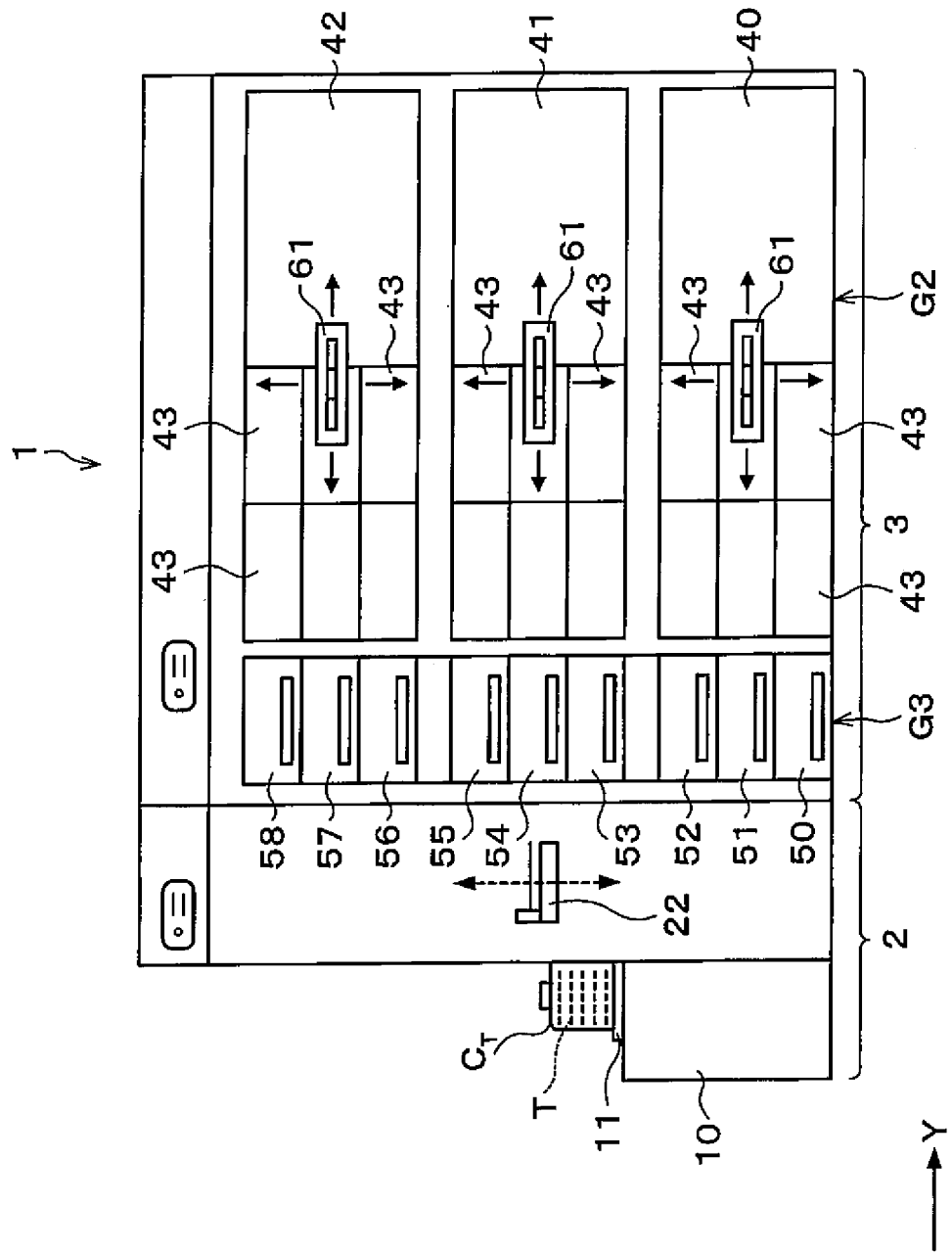
FIG. 2 is a side view schematically illustrating the inner configuration of the bonding system according to the present exemplary embodiment.

Hereinafter, an exemplary embodiment of the present disclosure will be described. FIG. 1 is a plan view schematically illustrating the configuration of a bonding system 1 according to the present embodiment. FIG. 2 is a side view schematically illustrating the inside configuration of bonding system 1.

Figure 3:
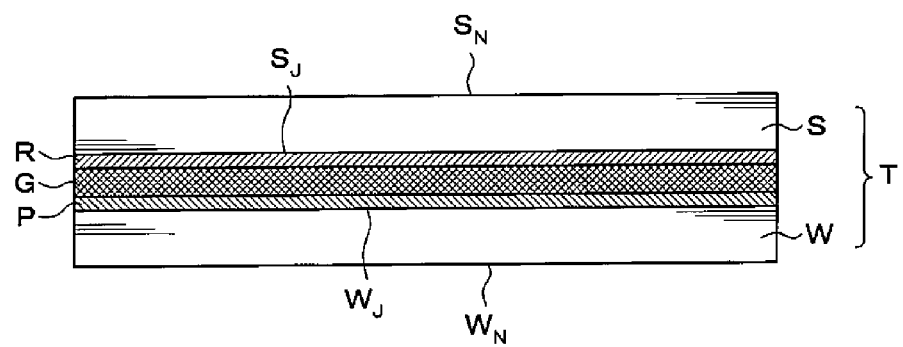
FIG. 3 is a side view illustrating a wafer and a support wafer.

In bonding system 1, as illustrated in FIG. 3, a wafer W as a substrate and a support wafer S as a support substrate are bonded to each other through, for example, an adhesive G, a protective agent P, and a remover R. Protective agent P, adhesive G, and remover R are provided between wafer W and support wafer S by being laminated in this order from a wafer W side. Then, bonding system 1 bonds wafer W to support wafer S, thereby forming a bonded wafer T as a bonded substrate.

In the description below, adhesive G, protective agent P and remover R may be generically referred to, for example, as adhesive G. Also, a layer of adhesive G may be called an adhesive film G, a layer of protective agent P may be called a protective film P, and a layer of a remover R may be called a releasing film R. Also, the surface of wafer W to be bonded to support wafer S through adhesive G is called a bonding surface $W_J$ as a front surface, and a reverse surface of bonding surface $W_J$ is called a non-bonding surface $W_N$ as a rear surface. In this manner, the surface of support wafer S to be bonded to wafer W through adhesive G is called a bonding surface $S_J$ as a front surface, and a reverse surface of bonding surface $S_J$ is called a non-bonding surface $S_N$ as a rear surface.

Also, wafer W is a wafer to become a product, in which, for example, a device including a plurality of electronic circuits or bumps is formed on bonding surface $W_J$, and non-bonding surface $W_N$ is subjected to a polishing processing. Also, support wafer S is a wafer which has the same diameter as that of wafer W and supports wafer W. In the description of the present exemplary embodiment, although a wafer is used as a support substrate, other substrates such as, for example, a glass substrate, may be used as well.

Herein, in bonding of wafer W to support wafer S, an object of using protective agent P and remover R will be described besides adhesive G.

Figure 4:
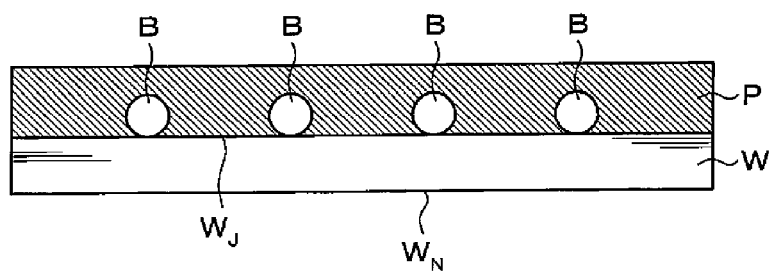
FIG. 4 is an explanatory view illustrating bumps formed on a wafer.

As illustrated in FIG. 4, on bonding surface $W_J$ of wafer W, a plurality of bumps B are formed. For example, in a case where bumps B are formed in a spherical shape, when adhesive G is supplied to bonding surface $W_J$, adhesive G having high viscosity may not be introduced into a gap between bumps B and bonding surface $W_J$, and bubbles may remain. In this case, when adhesive G is heated in the following processing, the bubbles may expand, thereby causing a damage to bumps B. Therefore, in order to suppress the bubbles from remaining in the gap between bumps B and bonding surface $W_J$, protective agent P having a lower viscosity than adhesive G is applied to bonding surface $W_J$ of wafer W. Further, in some kinds of adhesives G having a high viscosity, bubbles may remain in the gap between bumps B and bonding surface $W_J$ although bumps B are not formed in a spherical shape. Also, in this case, protective agent P having a lower viscosity than adhesive G is applied to bonding surface $W_J$ of wafer W.

Also, when a bonding processing is completed in bonding system 1, wafer W that is being bonded to support wafer S is subjected to a predetermined processing such as a polishing processing, and then is released from support wafer S. In order to smoothly release wafer W from support wafer S, remover R having a lower adhesive strength and a lower viscosity than adhesive G is applied to bonding surface $W_J$ of wafer W.

As illustrated in FIG. 1, for example, bonding system 1 has a configuration where a loading/unloading station 2 and a processing station 3 are integrally connected. Between loading/unloading station 2 and outside, cassettes $C_W$, $C_S$, and $C_T$ capable of accommodating a plurality of wafers W, a plurality of support wafers S, a plurality of bonded wafers T, respectively are loaded and unloaded. Processing station 3 includes various kinds of processing devices configured to perform a series of predetermined processing on wafer W, support wafer S, and bonded wafer T.

In loading/unloading station 2, a cassette loading rack 10 is provided. In cassette loading rack 10, a plurality of, for example, four, cassette loading plates 11 are provided. Cassette loading plates 11 are disposed side by side in a line in the X direction (in a vertical direction in FIG. 1). On cassette loading plates 11, cassettes $C_W$, $C_S$, and $C_T$ may be disposed when cassettes $C_W$, $C_S$, and $C_T$ are loaded or unloaded from/to the outside of bonding system 1. In this manner, loading/unloading station 2 is configured to be able to retain a plurality of wafers W, a plurality of support wafers S, and a plurality of bonded wafers T. Also, the number of cassette loading plates 11 is not limited to the present exemplary embodiment, but may be freely determined. Also, one of the cassettes may be used to collect a defective wafer. In other words, by the cassette, a wafer which has a defect in bonding of wafer W to support wafer S due to various causes may be separated from other normal bonded wafers T. In the present exemplary embodiment, from among a plurality of cassettes $C_T$, one cassette $C_T$ is used to collect a defective wafer, and the other cassette $C_T$ is used to accommodate normal bonded wafer T.

In loading/unloading station 2, wafer transfer section 20 is provided adjacently to cassette loading rack 10. In wafer transfer section 20, a wafer transfer mechanism 22 is provided which is capable moving on a transfer road 21 extending in the X direction. Wafer transfer mechanism 22 is also capable of moving in a perpendicular direction and around a perpendicular axis (θ direction), and may transfer wafer W, support wafer S, and bonded wafer T from/to cassettes $C_W$, $C_S$, and $C_T$ on respective cassette loading plates 11, to/from transition mechanisms 50 to 58 of a third processing block G3 of processing station 3 as described below.

In processing station 3, a plurality of, for example, three, processing blocks G1, G2, and G3 provided with various processing devices, are provided. For example, at a front side of processing station 3 (the minus X direction side in FIG. 1), first processing block G1 is provided, and at a rear side of processing station 3 (the plus X direction side in FIG. 1), second processing block G2 is provided. Also, at the side of loading/unloading station 2 of processing station 3 (the minus Y direction side in FIG. 1), third processing block G3 is provided.

For example, in first processing block G1, bonding devices 30 to 33 are disposed side by side in the Y direction in this order from the side of loading/unloading station 2, which pressingly bond wafer W to support wafer S through adhesive G, etc.

For example, in second processing block G2, as illustrated in FIG. 2, a plurality of applying devices, such as an adhesive applying device 40 configured to apply adhesive G to wafer W, a protective agent applying device 41 configured to apply protective agent P to wafer W, and a remover applying device 42 configured to apply remover R to support wafer S, and a plurality of heat processing devices 43 configured to perform a heat processing on wafer W or support wafer S are provided. Adhesive applying device 40, protective agent applying device 41, and remover applying device 42 are disposed in such a manner that they are layered in a high viscosity order of adhesive G, protective agent P, and remover R in the perpendicular direction from the lower side. In other words, adhesive applying device 40, protective agent applying device 41, and remover applying device 42 are layered in this order. Also, the number or the disposition of adhesive applying device 40, protective agent applying device 41, and remover applying device 42 may be freely determined.

The plurality of respective heat processing devices 43 are provided at positions closer to the side of loading/unloading station 2 as compared to adhesive applying device 40, protective agent applying device 41, and remover applying device 42. Also, for example, the plurality of respective heat processing devices 43 may be disposed in respective layers of adhesive applying device 40, protective agent applying device 41, and remover applying device 42. Also, the number or the disposition of heat processing devices 43 may be freely determined.

For example, in third block G3, a plurality of transition mechanisms 50, 51, 52, 53, 54, 55, 56, 57, and 58 are provided in this order in the perpendicular direction from the lower side.

As illustrated in FIG. 1, in an area surrounded by first processing block G1 to third processing block G3, a wafer transfer area 60 is formed. In wafer transfer area 60, for example, a wafer transfer mechanism 61 is disposed. The pressure within wafer transfer area 60 is more than an atmospheric pressure. In wafer transfer area 60, so-called an atmospheric transfer of wafer W, support wafer S, and bonded wafer T is performed.

Wafer transfer mechanism 61 has a transfer arm which is, for example, capable of moving in a perpendicular direction, a horizontal direction (Y direction, and X direction) and around a perpendicular axis. Wafer transfer mechanism 61 may move within wafer transfer area 60, while transferring wafer W, support wafer S, and bonded wafer T to predetermined devices within first processing block G1, second processing block G2 and third processing block G3 in the neighborhood of itself.

As illustrated in FIG. 2, a plurality of, for example, three, wafer transfer mechanisms 61 may be disposed in the perpendicular direction. Wafer transfer mechanisms 61 may be disposed at heights corresponding to adhesive applying device 40, protective agent applying device 41, and remover applying device 42, respectively. Also, wafer transfer mechanisms 61 may transfer wafer W, support wafer S, and bonded wafer T to predetermined devices at the same height levels as those of respective processing blocks G1 to G3.

As illustrated in FIG. 1, a wafer transfer mechanism 70 is provided at the lateral side at the plus X direction side of third processing block G3. Wafer transfer mechanism 70 has a transfer arm that is capable of moving, for example, in the X direction, the θ direction and the vertical direction. Wafer transfer mechanism 70 may perpendicularly move and transfer wafer W to respective transition mechanisms 50 to 58 within third processing block G3 while supporting wafer W.

Figure 5:
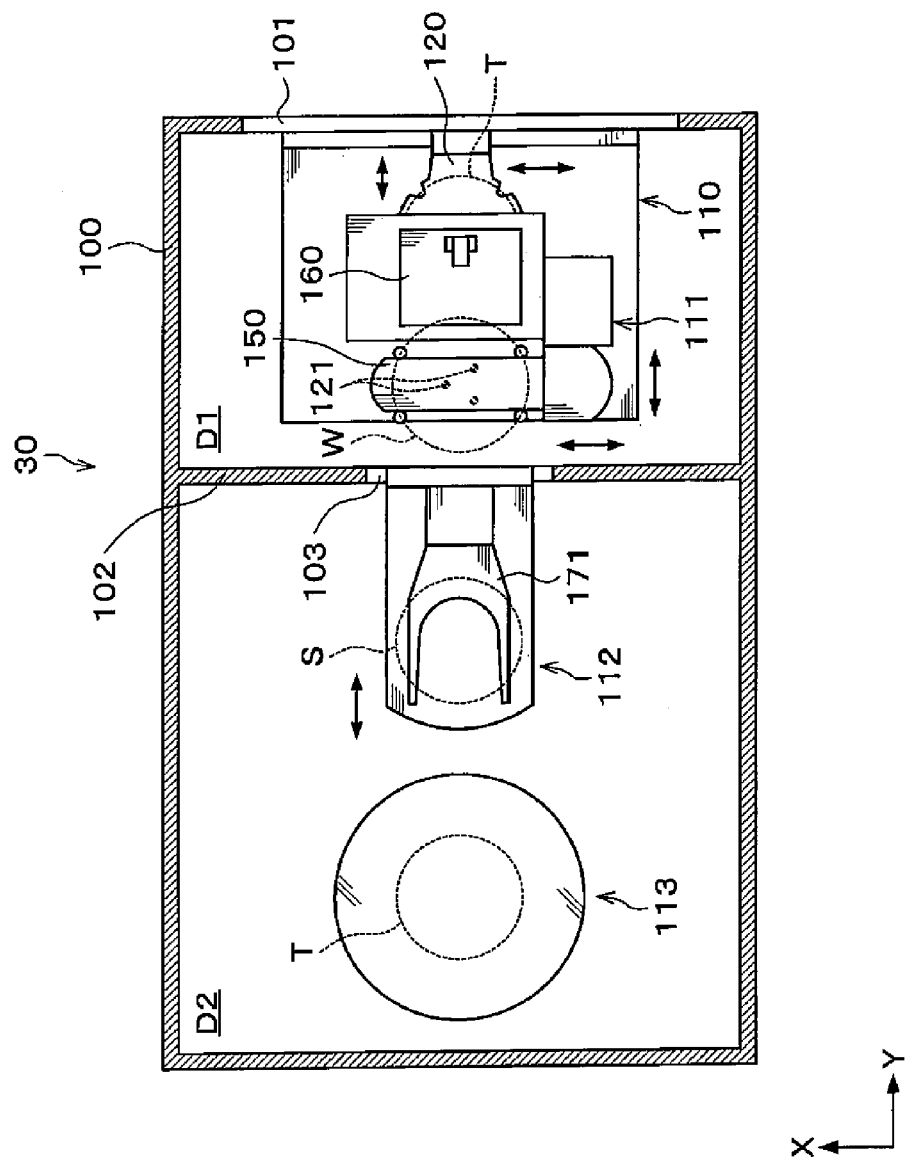
FIG. 5 is a cross sectional view schematically illustrating the configuration of a bonding device.

Hereinafter, the configuration of above described bonding devices 30 to 33 will be described. Bonding device 30, as illustrated in FIG. 5, has a processing chamber 100 of which the inside may be airtight. A loading/unloading opening 101 of wafer W, support wafer S, and bonded wafer T is formed in the lateral surface of processing chamber 100 at the side of wafer transfer area 60. In loading/unloading opening 101, an open/close shutter (not illustrated) is provided.

The inside of processing chamber 100 is divided into a preprocessing area D1 and a bonding area D2 by an inner wall 102. Loading/unloading opening 101 as described above is formed in the lateral surface of processing chamber 100 in preprocessing area D1. Also, in inner wall 102, a loading/unloading opening 103 of wafer W, support wafer S, and bonded wafer T is formed.

In preprocessing area D1, a delivery section 110 configured to deliver wafer W, support wafer S, and bonded wafer T from/to the outside of bonding device 30 is provided. Delivery section 110 is disposed adjacently to loading/unloading opening 101. Also, as described below, delivery sections 110 may be disposed in a plurality of, for example, two stages in the perpendicular direction, which deliver two of wafer W, support wafer S, and bonded wafer T at once. For example, in one delivery section 110, wafer W or support wafer S may be delivered before bonded, and in the other delivery section 110, bonded wafer T may be delivered after bonded. Otherwise, in one delivery section 110, wafer W may be delivered before bonded, and in the other delivery section 110, support wafer S may be delivered before bonded.

At the minus Y direction side, that is, at the side of loading/unloading opening 103 in preprocessing area D1, an inversion section 111 configured to turn over, for example, the front/rear surfaces of support wafer S is provided at a perpendicular position above delivery section 110. Also, inversion section 111, as described below, may adjust the position of the horizontal direction of support wafer S, and also adjust the position of the horizontal direction of wafer W.

At the plus Y direction side in bonding area D2, a transfer section 112 is provided which transfers wafer W, support wafer S, and bonded wafer T to delivery section 110, inversion section 111, and a bonding section 113 as described below. Transfer section 112 is attached to loading/unloading opening 103.

At the minus Y direction side in bonding area D2, bonding section 113 is provided which pressingly bonds wafer W to support wafer S through adhesive G, etc.

Figure 6:
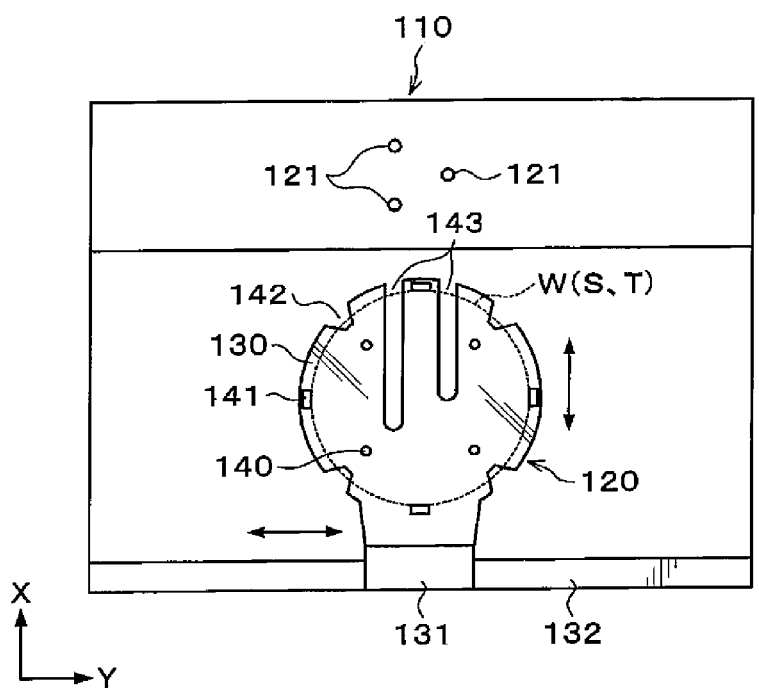
FIG. 6 is a plan view schematically illustrating the configuration of a delivery section.

Hereinafter, the configuration of delivery section 110 as described above will be described. Delivery section 110, as illustrated in FIG. 6, has a delivery arm 120 and wafer supporting pins 121. Delivery arm 120 may deliver wafer W, support wafer S, and bonded wafer T, between the outside of bonding device 30, that is, wafer transfer mechanism 61, and wafer supporting pins 121. Wafer supporting pins 121 may be provided at a plurality of, for example, three positions, so as to support wafer W, support wafer S, and bonded wafer T.

Delivery arm 120 has an arm part 130 configured to hold wafer W, support wafer S, and bonded wafer T, and an arm driving part 131 including, for example, a motor. Arm part 130 is formed in a nearly disc shape. Arm driving part 131 may move arm part 130 in the X direction (vertical direction in FIG. 6). Also, arm driving part 131 is configured in such a manner that it is attached to a rail 132 extending in the Y direction (horizontal direction in FIG. 6), and is capable of moving on rail 132. Through such configuration, delivery arm 120 is capable of moving in the horizontal direction (the X direction and the Y direction), and thus may smoothly deliver wafer W, support wafer S, and bonded wafer T between wafer transfer mechanism 61 and wafer supporting pins 121.

Figure 7:
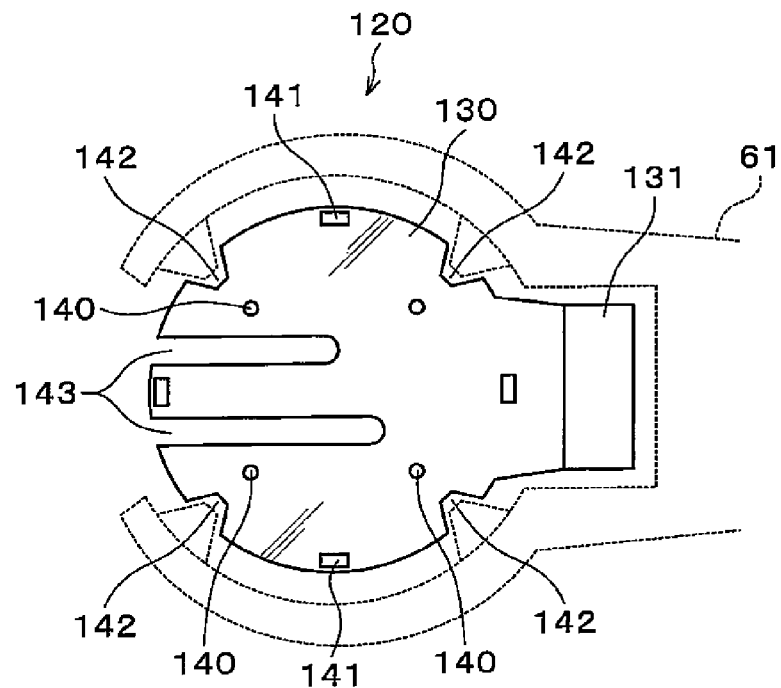
FIG. 7 is a plan view schematically illustrating the configuration of a delivery arm.
Figure 8:
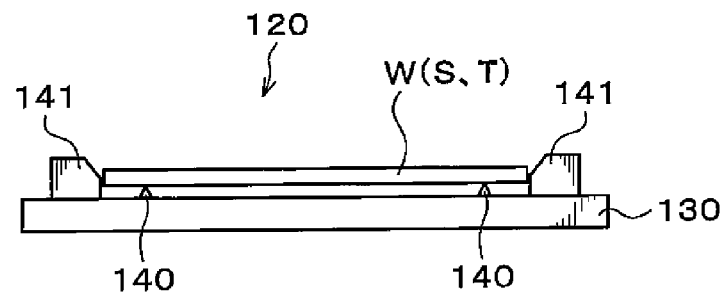
FIG. 8 is a side view schematically illustrating the configuration of a delivery arm.

On arm part 130, as illustrated in FIGS. 7 and 8, wafer supporting pins 140 are provided at a plurality of, for example, four positions, which support wafer W, support wafer S, and bonded wafer T. Also, on arm part 130, a guide 141 is provided which positions wafer W, support wafer S, and bonded wafer T supported by wafer supporting pins 140. Guides 141 are provided at a plurality of, for example, four positions, so as to guide the lateral surfaces of wafer W, support wafer S, and bonded wafer T.

At the outer circumference of arm part 130, as illustrated in FIGS. 6 and 7, cut-outs 142 are formed at, for example, 4 positions. Cut-outs 142 may suppress the transfer arm of wafer transfer mechanism 61 from interfering with arm part 130 when wafer W, support wafer S, and bonded wafer T are delivered from the transfer arm of wafer transfer mechanism 61 to delivery arm 120.

In arm part 130, two slits 143 are formed along the X direction. Slits 143 are formed from the periphery of arm part 130 at the side of wafer supporting pins 121, to the vicinity of the central portion of arm part 130. Slits 143 may suppress arm part 130 from interfering with wafer supporting pins 121.

Figure 9:
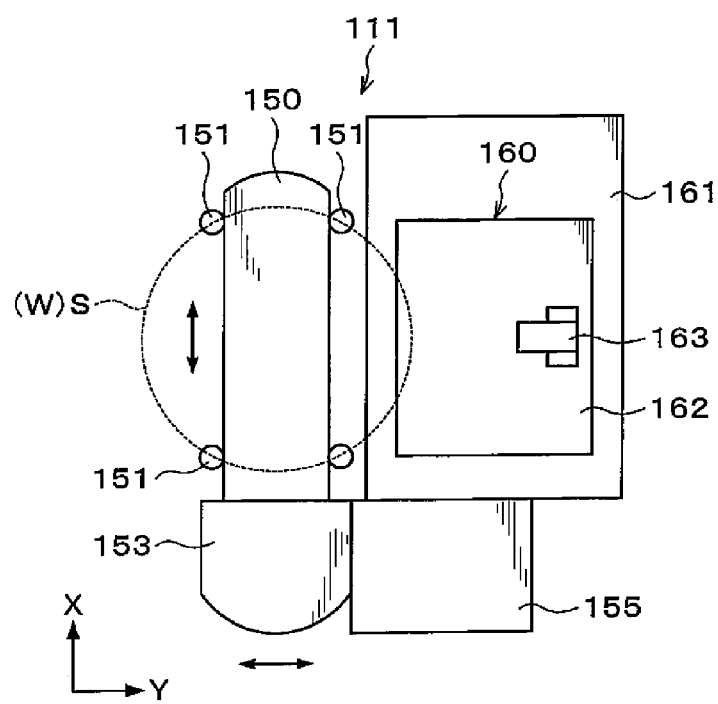
FIG. 9 is a plan view schematically illustrating the configuration of an inversion section.
Figure 10:
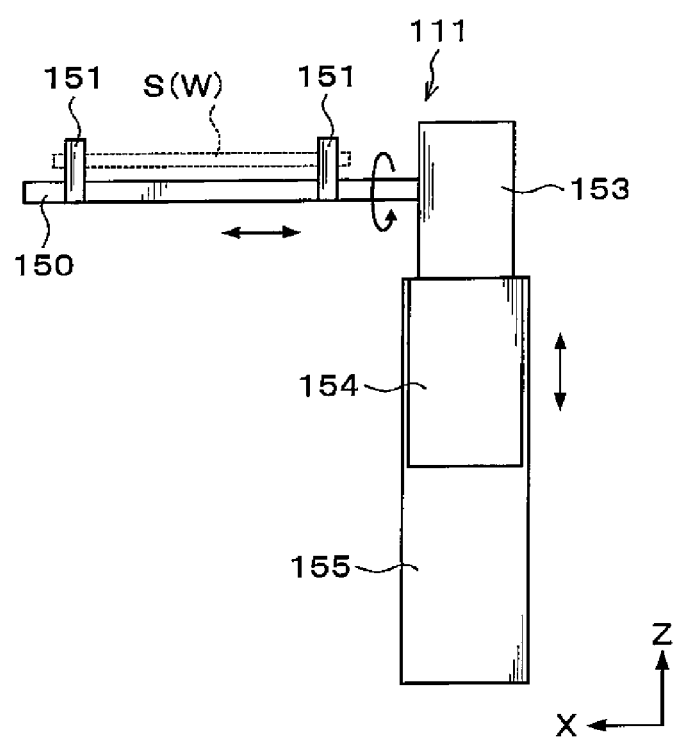
FIG. 10 is a side view schematically illustrating the configuration of an inversion section.
Figure 11:
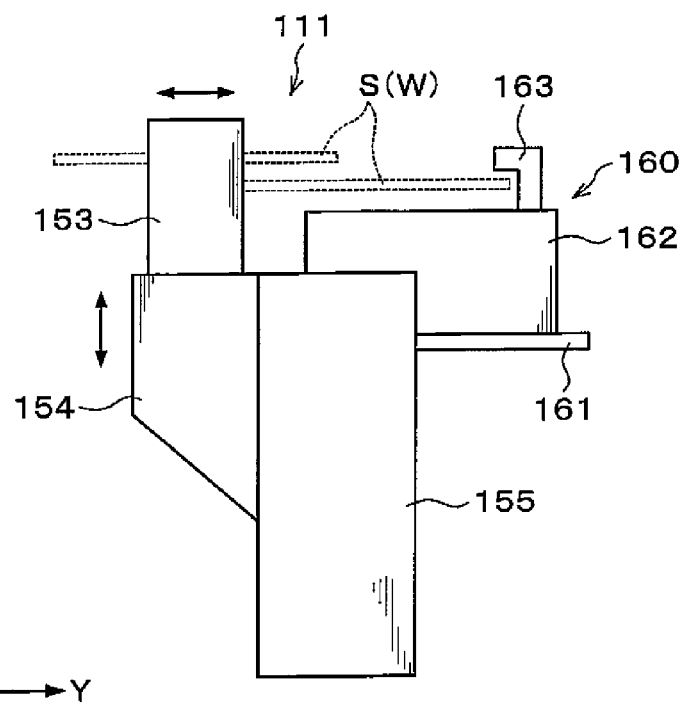
FIG. 11 is a side view schematically illustrating the configuration of an inversion section.
Figure 12:
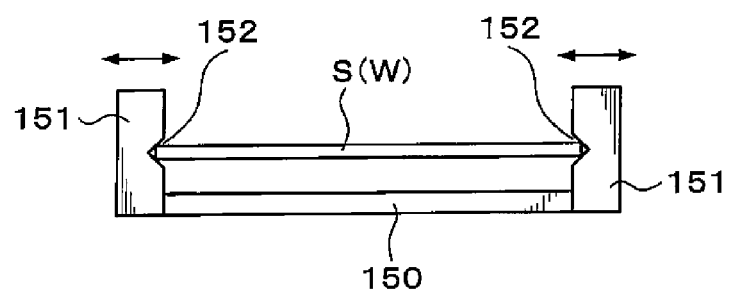
FIG. 12 is a side view schematically illustrating the configuration of a holding arm and holding members.

Hereinafter, the configuration of inversion section 111 as described above will be described. Inversion section 111, as illustrated in FIGS. 9 to 11, has a holding arm 150 configured to hold support wafer S and wafer W. Holding arm 150 extends in the horizontal direction (the X direction in FIGS. 9 and 10). Also, in holding arm 150, holding members 151 configured to hold support wafer S and wafer W are provided, for example, at four positions. Holding members 151, as illustrated in FIG. 12, are configured to be able to move in the horizontal direction with respect to holding arm 150. Also, at the lateral surface of each of holding members 151, a cut-out 152 configured to hold the outer circumferential portion of each of support wafer S and wafer W is formed. In holding members 151, support wafer S and wafer W may be inserted and held.

Holding arm 150, as illustrated in FIGS. 9 to 11, is supported by a first driving part 153 including, for example, a motor. First driving part 153 allows holding arm 150 to rotate around the horizontal axis, and also move in the horizontal direction (the X direction in FIGS. 9 and 10, and the Y direction in FIGS. 9 and 11). Also, first driving part 153 may rotate holding arm 150 around the perpendicular axis and move in the horizontal direction. Below first driving part 153, a second driving part 154 including, for example, a motor, is provided. Second driving part 154 allows first driving part 153 to move in the perpendicular direction along a supporting column 155 extending in the perpendicular direction. Thus, through first driving part 153 and second driving part 154, support wafer S and wafer W held by holding members 151 may be rotated around the horizontal axis and moved in the perpendicular direction and the horizontal direction.

In the supporting column 155, a position control mechanism 160 configured adjust the position of the horizontal direction of support wafer S, and wafer W held by holding members 151 is supported by a supporting plate 161. Position control mechanism 160 is provided adjacently to holding arm 150.

Position control mechanism 160 has a base 162, and a detection part 163 configured to detect the position of a notch of each of support wafer S and wafer W. Then, in position control mechanism 160, each of support wafer S and wafer W held by holding members 151 is moved in the horizontal direction, while the position of the notch of each of support wafer S and wafer W is detected by detection part 163. Thus, the position of the notch is adjusted so as to adjust the position of the horizontal direction of each of support wafer S and wafer W.

Figure 13:
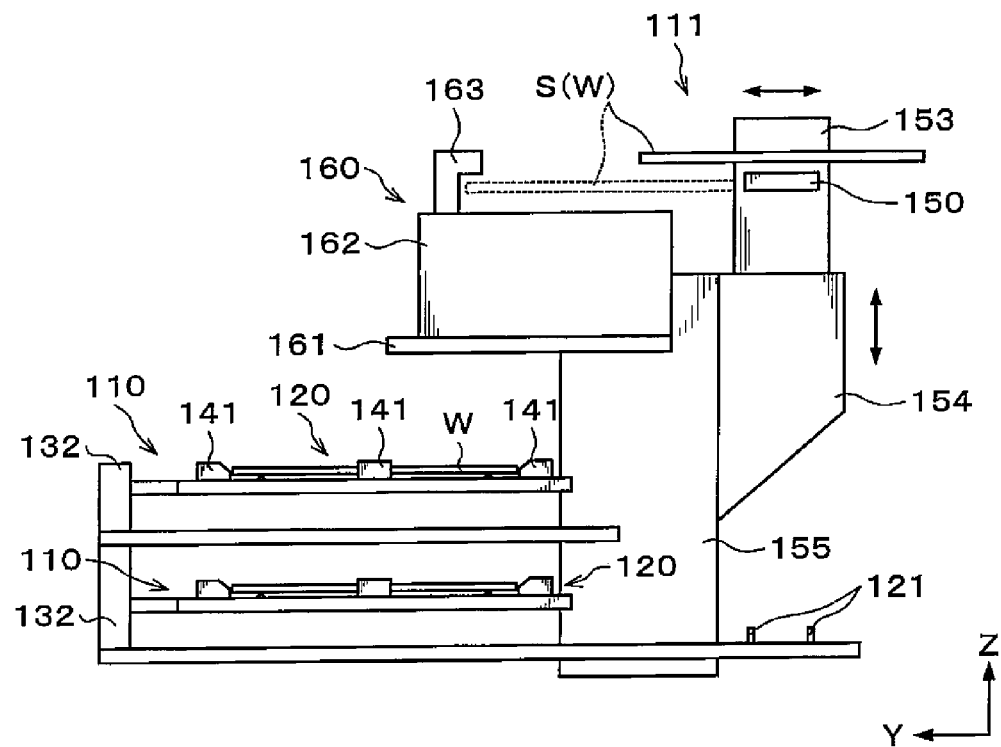
FIG. 13 is an explanatory view illustrating a position relation between a delivery section and an inversion section.

Also, as illustrated in FIG. 13, delivery section 110 as configured above is disposed in two stages in the perpendicular direction. Also, inversion section 111 is disposed at the perpendicular position above delivery sections 110. In other words, delivery arm 120 of delivery section 110 moves in the horizontal direction below holding arm 150 and position control mechanism 160 of inversion section 111. Also, wafer supporting pins 121 of delivery section 110 are disposed below holding arm 150 of inversion section 111.

Figure 14:
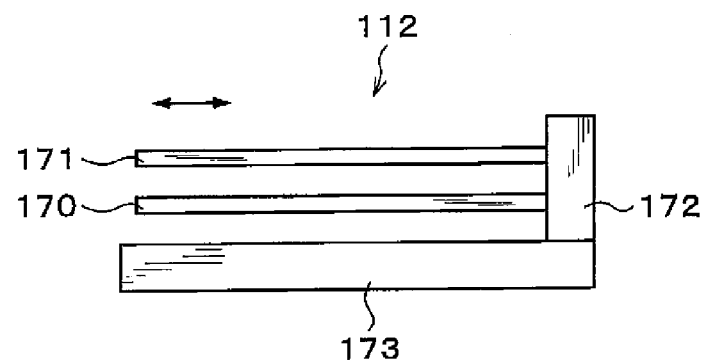
FIG. 14 is a side view schematically illustrating the configuration of a transfer section.

Hereinafter, the configuration of transfer section 112 as described above will be described. Transfer section 112, as illustrated in FIG. 14, has a plurality of, for example, two transfer arms 170 and 171. First transfer arm 170 and second transfer arm 171 are disposed in this order in two stages from bottom in the perpendicular direction. Also, first transfer arm 170 and second transfer arm 171, as described below, have different shapes.

At the base end of transfer arms 170 and 171, an arm driving part 172 including, for example, a motor is provided. Arm driving part 172 allows each of transfer arms 170 and 171 to independently move in the horizontal direction. Transfer arms 170 and 171, and arm driving part 172 are supported by a base 173.

Figure 15:
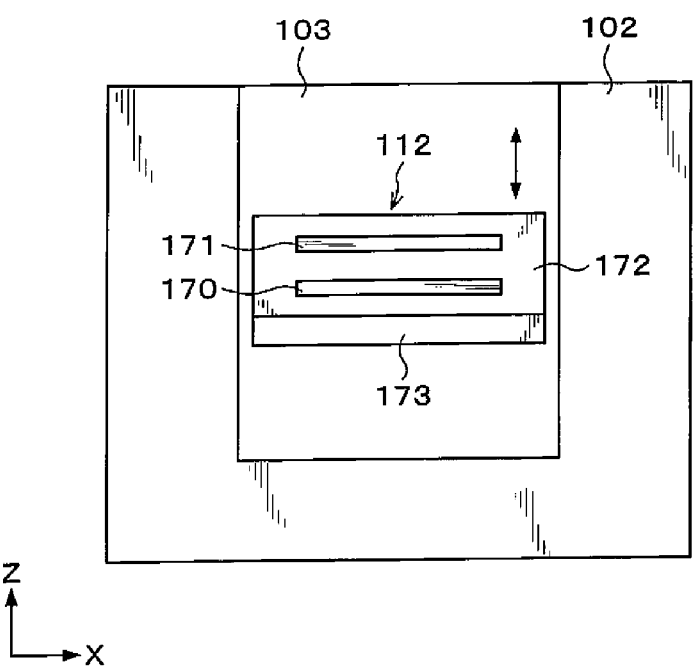
FIG. 15 is an explanatory view illustrating the state where a transfer section is disposed within a bonding device.

Transfer section 112, as illustrated in FIGS. 5 and 15, is provided in loading/unloading opening 103 formed in inner wall 102 of processing chamber 100. Also, transfer section 112 may be moved in the perpendicular direction along loading/unloading opening 103 by a driving part (not illustrated) including, for example, a motor.

First transfer arm 170 transfers each of wafer W, support wafer S, and bonded wafer T while holding the rear surface of each wafer (non-bonding surface $W_N$ or $S_N$ of wafer W or support wafer S). First transfer arm 170, as illustrated in FIG. 16, has an arm part 180 of which leading end is branched into two leading end portions 180a and 180a, and a supporting part 181 that is formed integrally with arm part 180 and also supports arm part 180.

Figure 16:
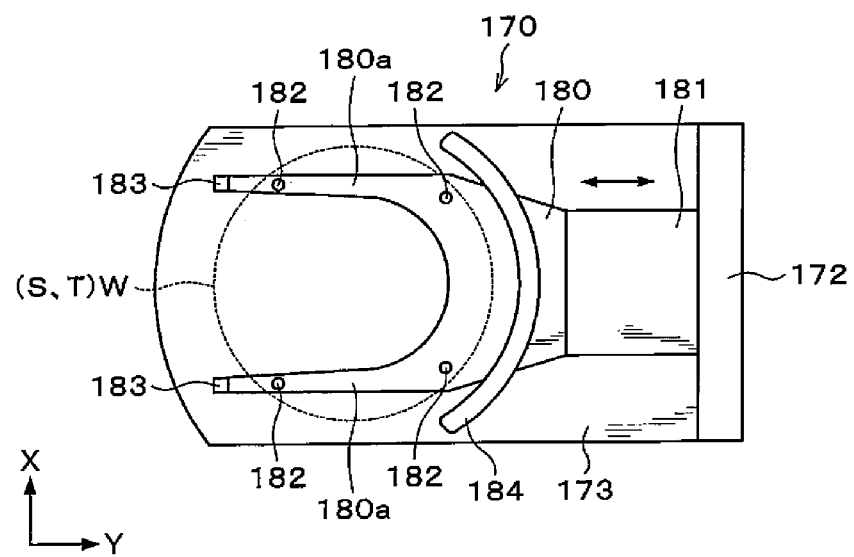
FIG. 16 is a plan view schematically illustrating the configuration of a first transfer arm.
Figure 17:
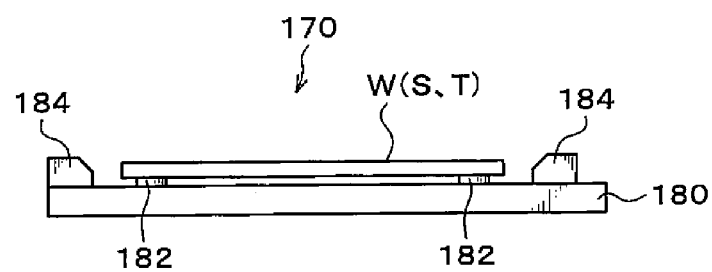
FIG. 17 is a side view schematically illustrating the configuration of a first transfer arm.

On arm part 180, as illustrated in FIGS. 16 and 17, O rings 182 made of a resin are provided at a plurality of, for example, four positions. O rings 182 are in contact with the rear surface of each of wafer W, support wafer S, and bonded wafer T, while holding the rear surface of each of wafer W, support wafer S, bonded wafer T by the frictional force between O rings 182 and the rear surface of each of wafer W, support wafer S, and bonded wafer T. Then, first transfer arm 170 may horizontally hold wafer W, support wafer S, and bonded wafer T on O rings 182.

Also, on arm part 180, guide members 183 and 184 are provided, which are provided at the outside of wafer W, support wafer S, and bonded wafer T held by O rings 182. First guide members 183 are provided at the leading ends of leading end portions 180a of arm part 180. Second guide member 184 is formed in a circular arc shape along the outer circumference of wafer W, support wafer S, and bonded wafer T, and is provided at the side of supporting part 181. Guide members 183 and 184 may suppress wafer W, support wafer S, and bonded wafer T from jumping out of first transfer arm 170, or from sliding down from first transfer arm 170. Also, when wafer W, support wafer S, and bonded wafer T are held at an appropriate position of O rings 182, wafer W, support wafer S, and bonded wafer T do not come in contact with guide members 183 and 184.

Second transfer arm 171, for example, transfers support wafer S by holding the outer circumferential portion of the front surface of support wafer S, that is, bonding surface SJ. In other words, second transfer arm 171 transfers support wafer S of which front and rear surfaces of support wafer S have been inversed in inversion section 111 by holding the outer circumferential portion of bonding surface SJ of support wafer S. Second transfer arm 171, as illustrated in FIG. 18, has an arm part 190 of which leading end is branched into two leading end portions 190a and 190a, and a supporting part 191 that is formed integrally with arm part 190 and also supports arm part 190.

Figure 18:
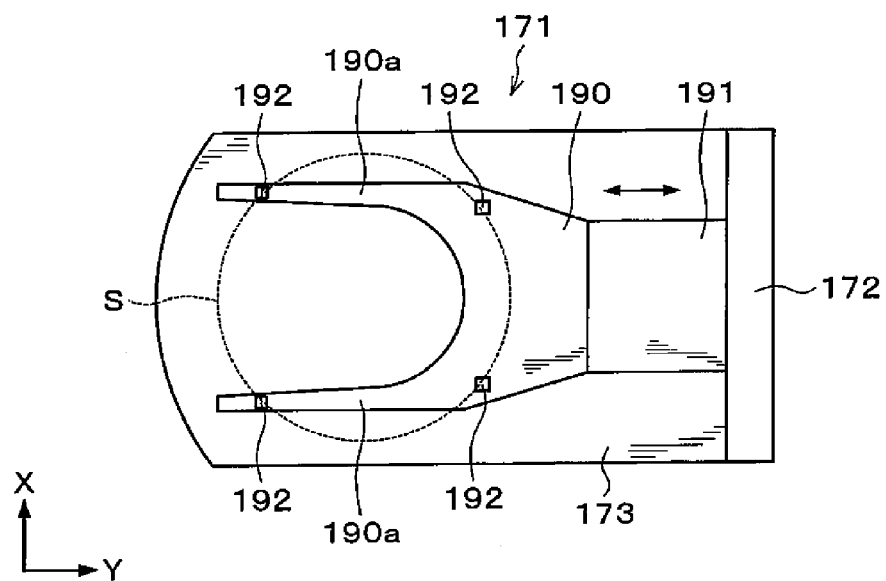
FIG. 18 is a plan view schematically illustrating the configuration of a second transfer arm.
Figure 19:
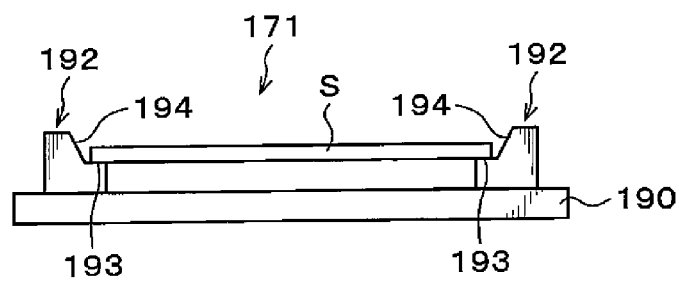
FIG. 19 is a side view schematically illustrating the configuration of a second transfer arm.

On arm part 190, as illustrated in FIGS. 18 and 19, second holding members 192 are provided at a plurality of, for example, four positions. Each of second holding members 192 has a disposition portion 193 on which the outer circumferential portion of bonding surface SJ of support wafer S is disposed, and a tapered portion 194 which extends upward from disposition portion 193 and has an inside surface enlarging from lower side to upper side in a taper shape. Disposition portion 193 holds the outer circumferential portion ranging from the periphery of support wafer S to less than, for example, 1 mm. Also, since the inside surface of tapered portion 194 enlarges from lower side to upper side in a taper shape, support wafer S is smoothly guided and positioned to tapered portion 194 and held by disposition portion 193 even if, for example, support wafer S delivered to second holding members 192 deviates from a determined position in the horizontal direction. Also, second transfer arm 171 may horizontally hold support wafer S on second holding members 192.

Figure 20:
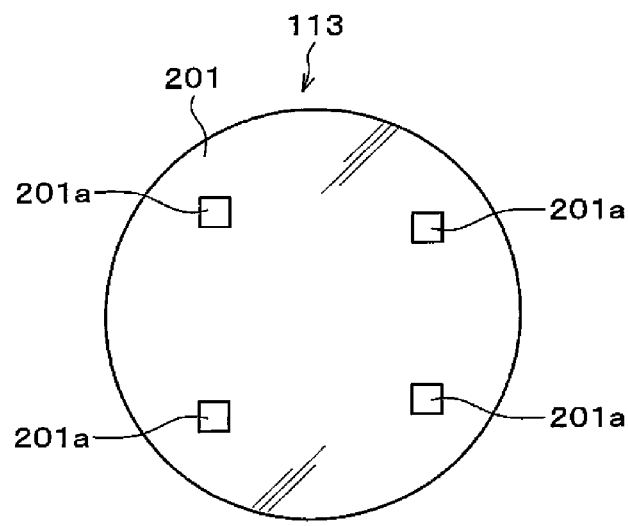
FIG. 20 is an explanatory view illustrating cut-outs formed in a second holding part.

Also, as illustrated in FIG. 20, a second holding part 201 of bonding section 113 as described below has cut-outs 201a formed, for example, at four positions. Cut-outs 201a may suppress second holding members 192 of second transfer arm 171 from interfering with second holding part 201 when support wafer S is delivered from second transfer arm 171 to second holding part 201.

Figure 21:
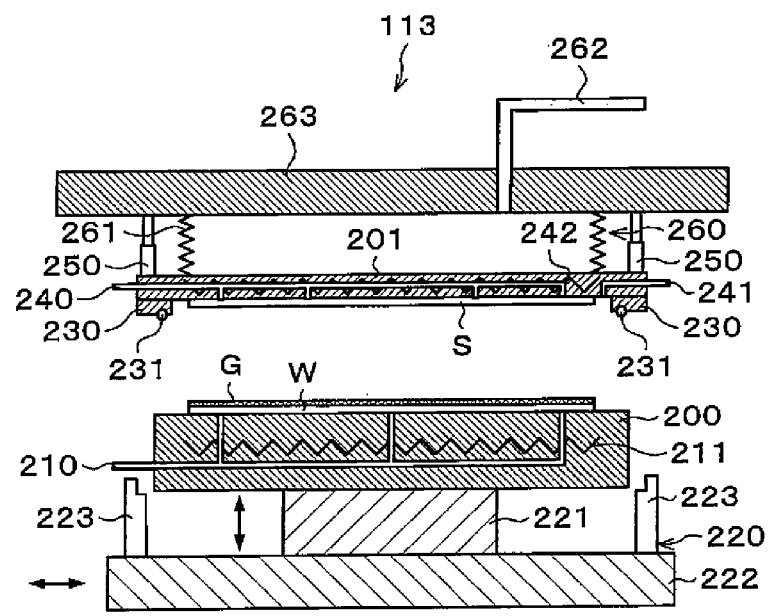
FIG. 21 is a vertical sectional view schematically illustrating the configuration of a bonding section.

Hereinafter, the configuration of bonding section 113 as described above will be described. Bonding section 113, as illustrated in FIG. 21, has a first holding part 200 on which wafer W is disposed and held on the top surface of first holding part 200, and second holding part 201 on which support wafer S is adsorbed to be held on the bottom surface of second holding part 201. First holding part 200 is provided below second holding part 201, and disposed in such a manner that it faces second holding part 201. In other words, wafer W held by first holding part 200 and support wafer S held by second holding part 201 are disposed in such a manner that they face each other.

A suction pipe 210 configured to adsorb and hold wafer W is provided within first holding part 200. Suction pipe 210 is connected to a negative pressure generator (not illustrated) such as, for example, a vacuum pump. Also, first holding part 200 is made of a material that has enough strength not to be deformed by a load applied through a compression mechanism 260 as described below, such as, for example, a ceramic (a silicon carbide ceramic or an aluminum nitride ceramic).

Also, within first holding part 200, a heating device 211 configured to heat wafer W is provided. As heating device 211, for example, a heater may be used.

Below first holding part 200, a moving mechanism 220 is provided which is configured to move first holding part 200 and wafer W in the perpendicular direction and in the horizontal direction. Moving mechanism 220 may three-dimensionally move first holding part 200, for example, with precision of ±1 μm. Moving mechanism 220 has a perpendicular moving part 221 that moves first holding part 200 in the perpendicular direction, and a horizontal moving part 222 that moves first holding part 200 in the horizontal direction. Each of perpendicular moving part 221 and horizontal moving part 222 has, for example, a ball screw (not illustrated) and a motor (not illustrated) configured to rotate the ball screw.

Supporting members 223 capable of extending in the perpendicular direction are provided on horizontal moving part 222. Supporting members 223 may be provided at the outside of first holding part 200, for example, at three positions. Then, supporting members 223, as illustrated in FIG. 22, may support a protrusion portion 230 protruding downward from the outer peripheral bottom surface of second holding part 201.

Figure 22:
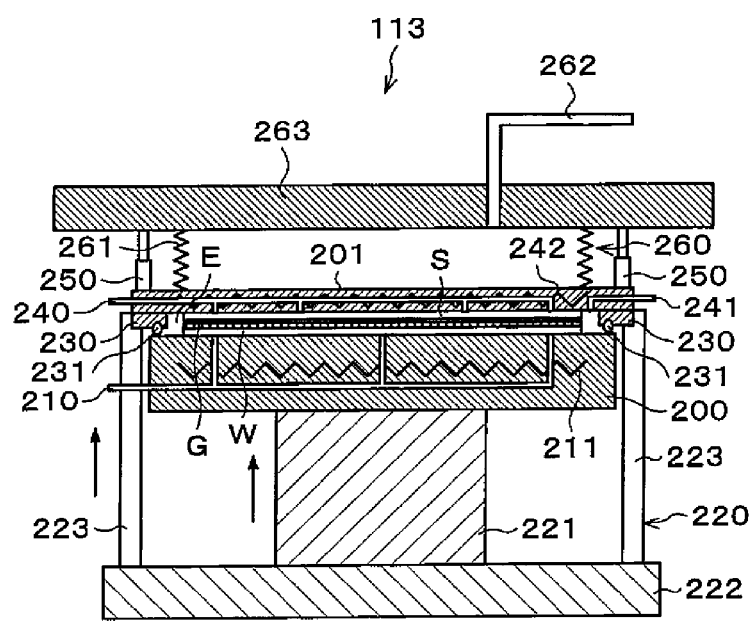
FIG. 22 is a vertical sectional view schematically illustrating the configuration of a bonding section.

By moving mechanism 220 as described above, the horizontal directional position of wafer W on first holding part 200 may be aligned, and as illustrated in FIG. 22, first holding part 200 may be raised, thereby forming a bonding space E configured to bond wafer W to support wafer S. Bonding space E is a space surrounded by first holding part 200, second holding part 201 and protrusion portion 230. Also, when bonding space E is formed, the perpendicular directional distance between wafer W and support wafer S in bonding space E may be adjusted by adjusting the height of supporting members 223.

Also, an elevating pin (not illustrated) which is configured to support and elevate wafer W or bonded wafer T from the lower side is provided below first holding part 200. Elevating pin is provided in such a manner that it may be inserted through a through hole (not illustrated) formed in first holding part 200 and protrude from the top surface of first holding part 200.

Second holding part 201 is made of an elastic body, for example, aluminum. Also, as described below, second holding part 201 is configured in such a manner that when the whole surface of second holding part 201 is compressed at a predetermined pressure, for example, 0.7 atm (=0.07 MPa), a part of the whole surface, for example, a central portion, is bent.

As illustrated in FIG. 21, protrusion portion 230 as described above is formed on the outer peripheral bottom surface of second holding part 201, which protrudes downward from the outer peripheral bottom surface. Protrusion portion 230 is formed along the outer circumference of second holding part 201. Also, protrusion portion 230 may be formed integrally with second holding part 201.

A sealing material 231 configured to maintain the airtightness of bonding space E is provided at the bottom surface of protrusion portion 230. Sealing material 231 is provided in an annular shape in the groove formed at the bottom surface of protrusion portion 230, and may employ, for example, an O-ring. Also, sealing material 231 has elasticity. Also, sealing material 231 is preferably a part having a sealing function, but is not limited to the present exemplary embodiment.

A suction pipe 240 configured to adsorb and hold support wafer S is provided within second holding part 201. Suction pipe 240 is connected to a negative pressure generator (not illustrated) such as, for example, a vacuum pump.

Also, an inhale pipe 241 configured to inhale the atmosphere of bonding space E is provided within second holding part 201. On end of inhale pipe 241 is opened in a place on the bottom surface of second holding part 201, where support wafer S is not held. Also, the other end of inhale pipe 241 is connected to a negative pressure generator (not illustrated) such as, for example, a vacuum pump.

Also, a heating device 242 configured to heat support wafer S is provided within second holding part 201. As for heating device 242, for example, a heater may be used.

On top surface of second holding part 201, supporting members 250 configured to support second holding part 201, and compression mechanism 260 configured to perpendicularly downwardly compress second holding part 201 are provided. Compression mechanism 260 has a pressure vessel 261 that is provided to cover wafer W and support wafer S, and a fluid supply tube 262 configured to supply a fluid, for example, a compressed air, to the inside of pressure vessel 261. Also, supporting members 250 are configured to be able to extend in the perpendicular direction and provided at, for example, three positions at the outside of pressure vessel 261.

Pressure vessel 261 includes a bellows made of, for example, stainless steel which is able to extend in, for example, the perpendicular direction. The bottom surface of pressure vessel 261 is in contact with the top surface of second holding part 201, and the top surface of pressure vessel 261 is in contact with the bottom surface of a supporting plate 263 provided above second holding part 201. One end of fluid supply tube 262 is connected to pressure vessel 261, and the other end is connected to a fluid supply source (not illustrated). Then, when the fluid is supplied to pressure vessel 261 from fluid supply tube 262, pressure vessel 261 extends. Here, since the top surface of pressure vessel 261 is in contact with the bottom surface of supporting plate 263, pressure vessel 261 may extend only downwards, thereby downwardly compressing second holding part 201 provided at the bottom surface of pressure vessel 261. Also, here, since the inside of pressure vessel 261 is compressed by the fluid, pressure vessel 261 may uniformly compress second holding part 201 in its plane. When second holding part 201 is compressed, the adjustment of the load is carried out by adjusting the pressure of the compressed air to be supplied to pressure vessel 261. Also, supporting plate 263 is preferably made of a material that has enough strength not to be deformed by a reaction force against the load applied to second holding part 201 through compression mechanism 260. Also, supporting plate 263 according to the present exemplary embodiment may be omitted while the top surface of pressure vessel 261 may be in contact with the ceiling surface of processing chamber 100.

Also, the configurations of bonding devices 31 to 33 are the same as the above described configuration of bonding device 30, and thus their description will be omitted.

Figure 23:
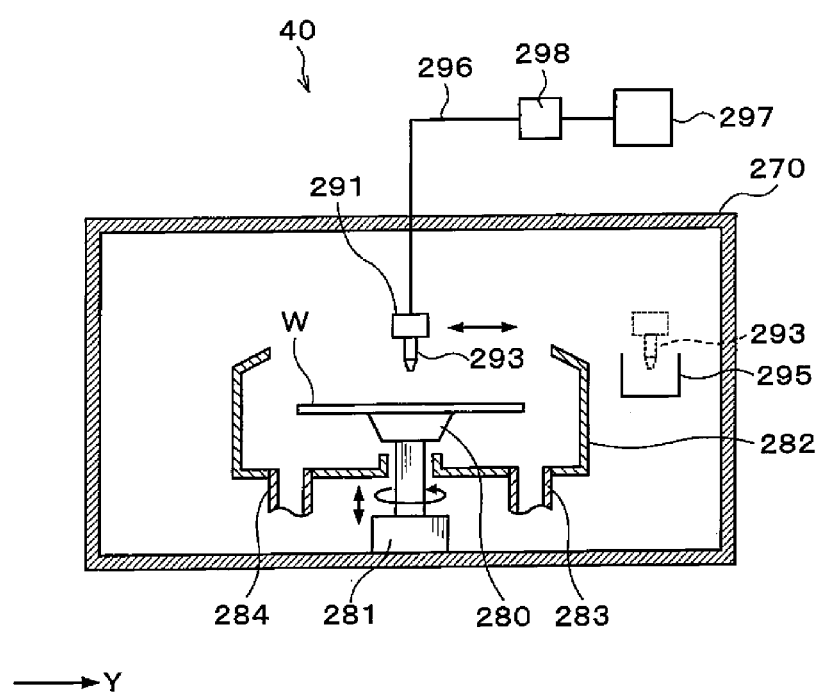
FIG. 23 is a vertical sectional view schematically illustrating the configuration of an adhesive applying device.

Hereinafter, the configuration of adhesive applying device 40 as described above will be described. Adhesive applying device 40, as illustrated in FIG. 23, has a processing chamber 270 of which the inside may be airtight. In processing chamber 270, a loading/unloading opening (not illustrated) of wafer W is formed in the lateral surface at the side of wafer transfer area 60, and the loading/unloading opening is provided with an open/close shutter (not illustrated).

A spin chuck 280 configured to hold and rotate wafer W is provided at the central portion within processing chamber 270. Spin chuck 280 has a horizontal top surface, and the top surface has, for example, a suction hole (not illustrated) configured to suck wafer W. Through the suction by the suction hole, wafer W may be adsorbed to be held on spin chuck 280.

A chuck driving part 281 provided with, for example, a motor is provided below spin chuck 280. Spin chuck 280 may be rotated at a predetermined speed by chuck driving part 281. Also, in chuck driving part 281, an elevating driving source, such as, for example, a cylinder, is provided, by which spin chuck 280 is able to be raised and lowered.

Around spin chuck 280, a cup 282 is provided which is configured to receive and collect a liquid scattered or dropped from wafer W. At the bottom surface of cup 282, a drain pipe 283 and an exhaustion pipe 284 are connected. Drain cup 283 is configured to discharge the collected liquid, and exhaustion pipe 284 is configured to evacuate and exhaust the atmosphere within cup 282.

Figure 24:
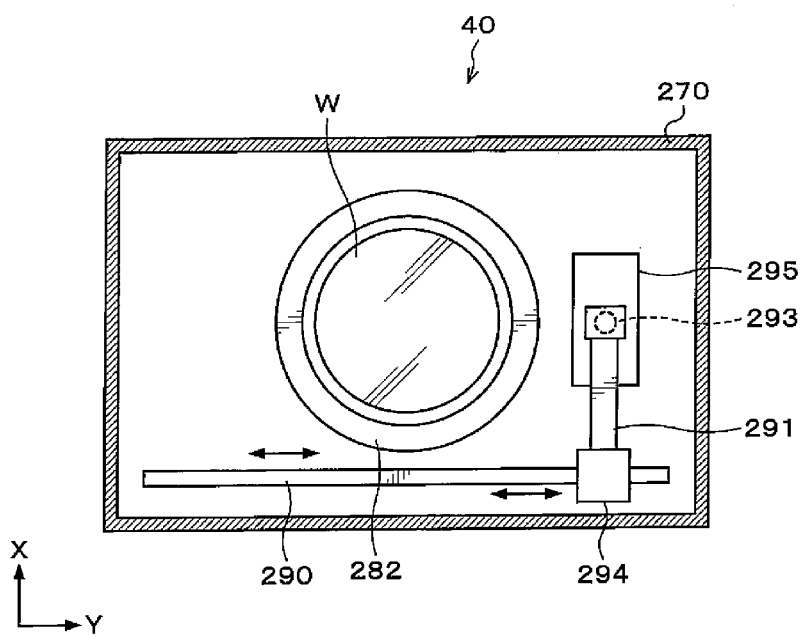
FIG. 24 is a cross sectional view schematically illustrating the configuration of an adhesive applying device.

As illustrated in FIG. 24, a rail 290 that extends along the Y direction (the horizontal direction in FIG. 24) is formed at the minus X direction side of cup 282 (the downward direction in FIG. 24). Rail 290, is, for example, formed from the outside at the minus Y direction side (the left side in FIG. 24) of cup 282 to the outside at the plus Y direction side (the right side in FIG. 24). An arm 291 is attached to rail 290.

As illustrated in FIGS. 23 and 24, an adhesive nozzle 293, as an adhesive supply part, configured to supply adhesive G in a liquid state to wafer W is supported by arm 291. Arm 291 may move on rail 290 by a nozzle driving part 294 illustrated in FIG. 24. Thus, adhesive nozzle 293 may move from a stand-by portion 295 provided at the outside at the plus Y direction side of cup 282 to a position above the central portion of wafer W within cup 282, and also move above wafer W in the diametrical direction of wafer W. Also, arm 291 may be raised and lowered by nozzle driving part 294, thereby adjusting the height of adhesive nozzle 293.

As illustrated in FIG. 23, a supply tube 296 configured to supply adhesive G to adhesive nozzle 293 is connected to adhesive nozzle 293. Supply tube 296 is communicated with an adhesive supply source 297 configured to collect adhesive G therein. Also, supply tube 296 is provided with a supply device group 298 including, for example, a valve or a flow control part for controlling the flow of adhesive G.

Also, a back rinse nozzle (not illustrated) may be provided below spin chuck 280, which is configured to spray a cleaning liquid toward the rear surface of wafer W, that is, non-bonding surface WN. By the cleaning liquid sprayed from the back rinse nozzle, non-bonding surface WN of wafer W and the outer circumferential portion of wafer W are cleaned.

Also, protective agent applying device 41 has the same configuration as that of adhesive applying device 40, but has, instead of adhesive nozzle 293, a protective agent nozzle (not illustrated), as a protective agent supply part, configured to supply protective agent P to wafer W. The protective agent nozzle is connected to supply tube 296 communicating with a protective agent supply source (not illustrated), in which within the protective agent supply source, protective agent P is collected. Also, remover applying device 42 has the same configuration as that of adhesive applying device 40, but has, instead of adhesive nozzle 293, a remover nozzle (not illustrated), as a remover supply part, configured to supply remover R to support wafer S. The remover nozzle is connected to supply tube 296 communicating with a remover supply source (not illustrated), in which within the remover supply source, remover R is collected.

Hereinafter, the configuration of heat processing devices 43 as described above will be described. Although each of heat processing devices 43 performs a heat processing on wafer W or support wafer S, the case of performing a heat processing on wafer W will be described below.

Figure 25:
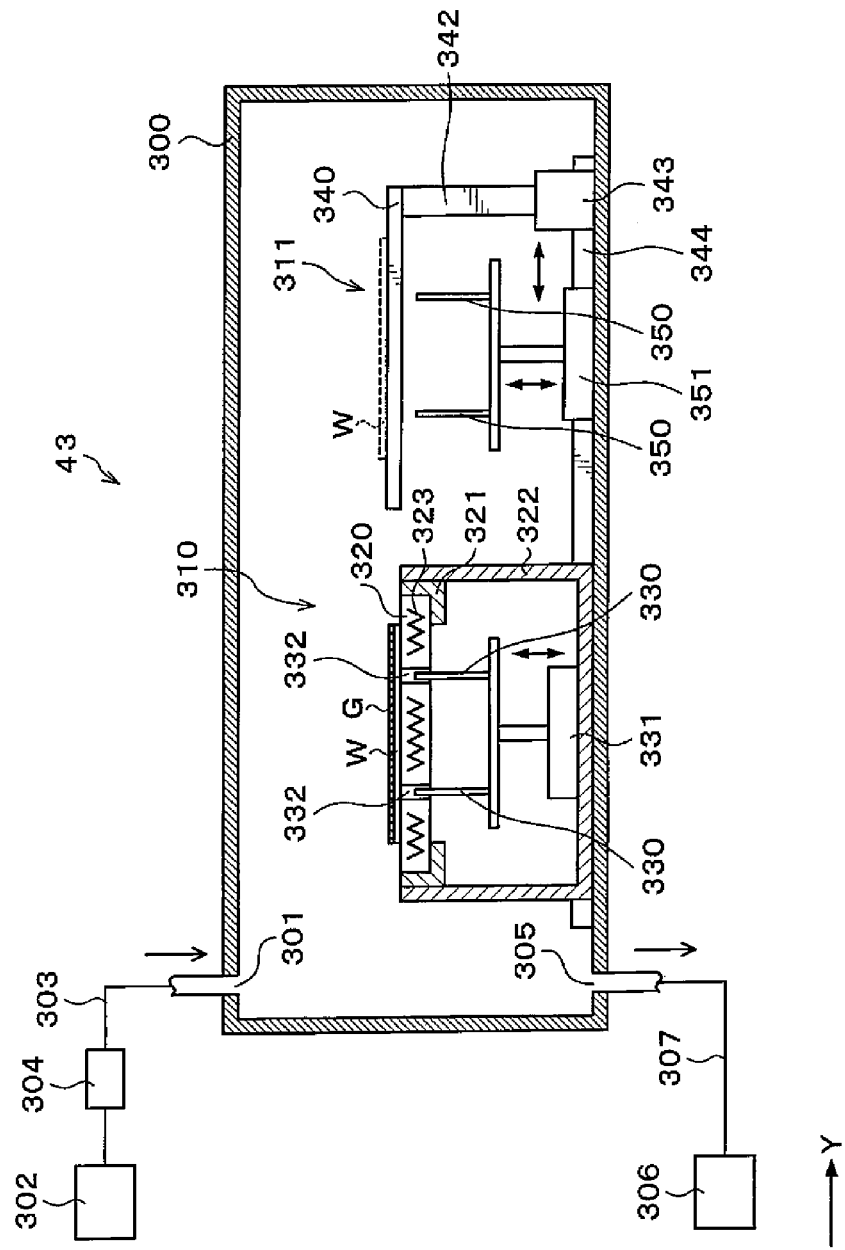
FIG. 25 is a vertical sectional view schematically illustrating the configuration of a heat processing device.

As illustrated in FIG. 25, heat processing device 43 has a processing chamber 300 of which inside may be closed. In the lateral surface of processing chamber 300 at the side of wafer transfer area 60, a loading/unloading opening (not illustrated) of wafer W is formed, and the loading/unloading opening is provided with an open/close shutter (not illustrated).

At the ceiling surface of processing chamber 300, a gas supply hole 301 configured to supply an inert gas such as, for example, a nitrogen gas, into processing chamber 300 is formed. Gas supply hole 301 is connected to a gas supply tube 303 communicating with a gas supply source 302. Also, gas supply tube 303 is provided with a supply device group 304 including, for example, a valve or a flow control part for controlling the flow of the inert gas.

At the bottom surface of processing chamber 300, an inhale hole 305 configured to inhale the atmosphere within processing chamber 300 is formed. Inhale hole 305 is connected to an inhale pipe 307 communicating with a negative pressure generator 306 such as, for example, a vacuum pump.

A heating section 310 configured to perform a heat processing on wafer W, and a temperature control section 311 configured to control the temperature of wafer W are provided within processing chamber 300. Heating section 310 and temperature control section 311 are disposed side by side in the Y direction.

Heating section 310 includes an annular holding member 321 configured to accommodate a heating plate 320 and hold the outer circumferential portion of heating plate 320, and a nearly cylindrical support ring 322 configured to surround the outer periphery of holding member 321. Heating plate 320 is formed in a nearly disc shape with a thickness, on which wafer W may be disposed and heated. Also, within heating plate 320, for example, a heater 323 is embedded. The heating temperature of heating plate 320 is controlled by, for example, a control unit 360 so that wafer W disposed on heating plate 320 may be heated up to a predetermined temperature.

Below heating plate 320, for example, three elevating pins 330 configured to support and elevate wafer W from the lower side, are provided. Elevating pins 330 may move up and down by an elevating driving part 331. In the vicinity of the central portion of heating plate 320, through holes 332 configured to penetrate heating plate 320 in the thickness direction are formed at, for example, three positions. Elevating pins 330 are configured to be capable of being inserted through holes 332 and protruding from the top surface of heating plate 320.

Figure 26:
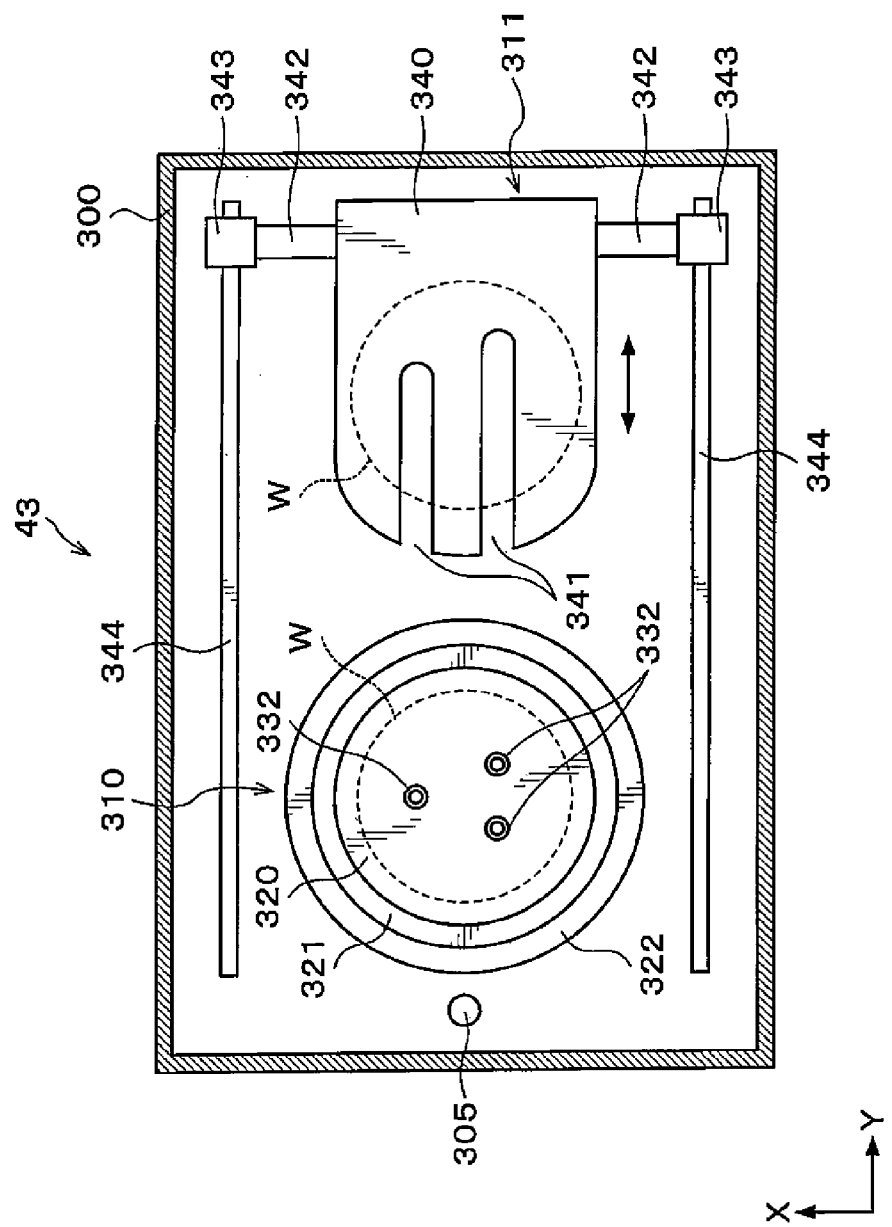
FIG. 26 is a cross sectional view schematically illustrating the configuration of a heat processing device.

Temperature control section 311 has a temperature control plate 340. As illustrated in FIG. 26, temperature control plate 340 is formed in a nearly rectangular planar shape, and its peripheral surface at the side of heating plate 320 is curved in a circular arc shape. Two slits 341 along the Y direction are formed in temperature control plate 340. Slits 341 are formed from the peripheral surface of temperature control plate 340 at the side of heating plate 320, to the vicinity of the central portion of temperature control plate 340. Slits 341 may suppress temperature control plate 340 from interfering with elevating pins 330 of heating section 310, and elevating pins 350 as described below of temperature control section 311. Also, within temperature control plate 340, a temperature control member (not illustrated) such as, for example, a Peltier element is embedded. The cooling temperature of temperature control plate 340 is controlled by, for example, control unit 360 so that wafer W disposed on temperature control plate 340 may be cooled down to a predetermined temperature.

As illustrated in FIG. 25, temperature control plate 340 is supported by a supporting arm 342. A driving part 343 is attached to supporting arm 342. Driving part 343 is attached to a rail 344 which extends in the Y direction. Rail 344 extends from temperature control section 311 to heating section 310. By driving part 343, temperature control plate 340 is capable of moving from heating section 310 to temperature control section 311 along rail 344.

Below temperature control plate 340, for example, three elevating pins 350 configured to support and elevate wafer W from the lower side are provided. Elevating pins 350 may move up and down by an elevating driving part 351. Also, elevating pins 350 are configured to be capable of being inserted through slits 341 and protruding from the top surface of temperature control plate 340.

Also, in heat processing device 43, the temperature of bonded wafer T may be controlled. Otherwise, in order to perform a temperature control of bonded wafer T, a temperature control device (not illustrated) may be provided. The temperature control device has the same configuration as that of heat processing device 43 as described above, and employs a temperature control plate instead of heating plate 320. Within the temperature control plate, a cooling member such as, for example, a Peltier element is provided so as to control the temperature control plate to a predetermined temperature.

As illustrated in FIG. 1, bonding system 1 as described above is provided with control unit 360. For example, control unit 360 is a computer, and has a program storage unit (not illustrated). In program storage unit, a program for controlling the processing on wafer W, support wafer S, and bonded wafer T in bonding system 1 is stored. Also, in program storage unit, another program which is configured to control an operation of a driving system of the above described various kinds of processing devices or transfer devices so as to execute a bonding processing as described below in bonding system 1 is stored. Also, the programs are recorded in a computer-readable storage medium H such as, for example, a computer-readable hard disc (HD), a flexible disc (FD), a compact disc (CD), a magneto-optical disc (MO), and a memory card, and may be installed from storage medium H to control unit 360.

Figure 27:
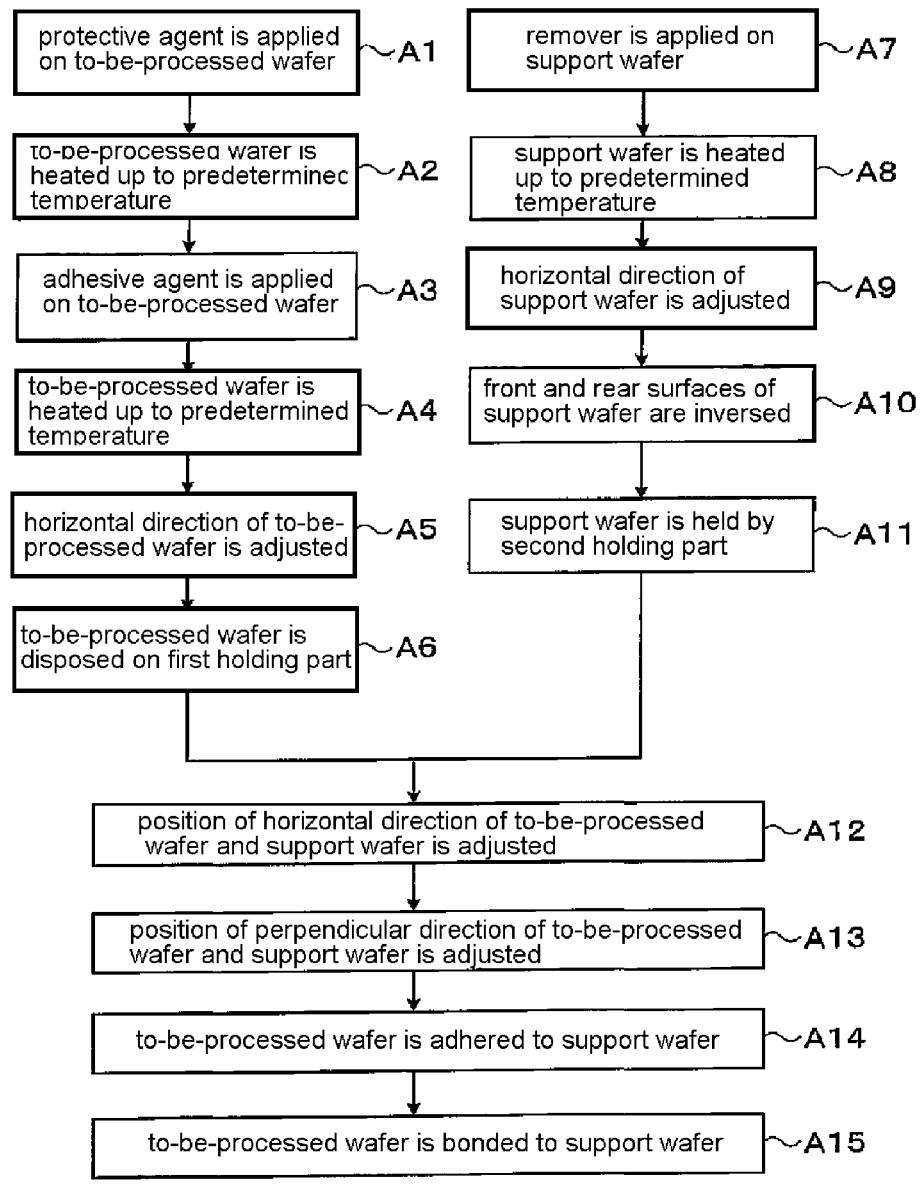
FIG. 27 is a flow chart illustrating a main process of a bonding processing.

Hereinafter, a method of a bonding processing on wafer W and support wafer S, which is performed by using bonding system 1 as configured above will be described. FIG. 27 is a flow chart exemplarily illustrating a main process of such a bonding processing.

First, cassette CW that accommodates a plurality of wafers W, cassette CS that accommodates a plurality of support wafers S, and empty cassette CT are disposed at predetermined cassette loading plates 11 of loading/unloading station 2. Then, by wafer transfer mechanism 22, wafer W within cassette CW is taken out, and transferred to transition mechanism 53 of third processing block G3 of processing station 3. Herein, wafer W is transferred while its non-bonding surface WN is toward a lower side.

Then, wafer W is transferred to protective agent applying device 41 by wafer transfer mechanism 61. Wafer W carried into protective agent applying device 41 is delivered from wafer transfer mechanism 61 to spin chuck 280 and is adsorbed to be held. Herein, non-bonding surface WN of wafer W is adsorbed to be held.

Subsequently, the protective agent nozzle at stand-by portion 295 is moved by arm 291 to a position above the central portion of wafer W. Then, wafer W is rotated by spin chuck 280 while protective agent P is supplied from the protective agent nozzle to bonding surface WJ of wafer W. Supplied protective agent P is diffused on the whole surface of bonding surface WJ of wafer W by a centrifugal force, and thus applied to bonding surface WJ of wafer W (step A1 in FIG. 27). Herein, since protective agent P has a low viscosity, protective agent P is applied to bonding surface WJ without causing bubbles to remain in the gap between bonding surface WJ and a device, especially, bumps B.

Then, wafer W is transferred to heat processing device 43 by wafer transfer mechanism 61. Herein, the inside of heat processing device 43 is maintained under an inert gas atmosphere. When wafer W is carried into heat processing device 43, wafer W is delivered from wafer transfer mechanism 61 to elevating pins 350 which have been previously raised and waited. Subsequently, elevating pins 350 are lowered so as to dispose wafer W on temperature control plate 340.

Then, temperature control plate 340 is moved to a position above heating plate 320 along rail 344 by driving part 343, and wafer W is delivered to elevating pins 330 which have been previously raised and waited. Then, elevating pins 330 are lowered so as to dispose wafer W on heating plate 320. Then, wafer W on heating plate 320 is heated up to a predetermined temperature, for example, 170° C. (step A2 in FIG. 27). Through such heating by heating plate 320, protective agent P on wafer W is heated and hardened to form protective film P on wafer W.

Then, elevating pins 330 are raised, and temperature control plate 340 is moved to a position above heating plate 320. Subsequently, wafer W is delivered from elevating pins 330 to temperature control plate 340, and temperature control plate 340 is moved toward wafer transfer area 60. While temperature control plate 340 is moved, the temperature of wafer W is controlled to a predetermined temperature.

Then, wafer W is transferred to transition mechanism 54 by wafer transfer mechanism 61, and then transferred to transition mechanism 50 by wafer transfer mechanism 70.

Next, wafer W is transferred to adhesive applying device 40 by wafer transfer mechanism 61. Then, in adhesive applying device 40, adhesive G is applied on bonding surface WJ of wafer W, that is, on protective agent P (step A3 in FIG. 27). Also, this step A3 is the same as the step A1 as described above, and thus its description will be omitted.

Next, wafer W is transferred to heat processing device 43 by wafer transfer mechanism 61. Then, in heat processing device 43, wafer W is heated up to a predetermined temperature, for example, a temperature ranging from 100° C. to 300° C. (step A4 in FIG. 27). Through such heating, adhesive G on wafer W is heated and hardened so as to form adhesive film G on wafer W. Also, this step A4 is the same as the step A2 as described above, and thus its description will be omitted.

Next, wafer W is transferred to bonding device 30 by wafer transfer mechanism 61. Wafer W transferred to bonding device 30 is delivered from wafer transfer mechanism 61 to delivery arm 120 of delivery section 110, and then delivered from delivery arm 120 to wafer supporting pins 121. Then, wafer W is transferred from wafer supporting pins 121 to inversion section 111 by first transfer arm 170 of transfer section 112.

Wafer W transferred to inversion section 111 is held by holding members 151, and moved to position control mechanism 160. Then, in position control mechanism 160, the position of a notch of wafer W is adjusted so as to adjust the position of the horizontal direction of wafer W (step A5 in FIG. 27).

Then, wafer W is transferred from inversion section 111 to bonding section 113 by first transfer arm 170 of transfer section 112. Wafer W transferred to bonding section 113 is disposed on first holding part 200 (step A6 in FIG. 27). On first holding part 200, wafer W is disposed while bonding surface WJ of wafer W is toward an upper side, in other words, adhesive G and protective agent P are toward an upper side.

While wafer W is subjected to the above described processing of steps A1 to A6, processing on support wafer S are performed subsequently to wafer W. Support wafer S is taken out from the inside of cassette CW by wafer transfer mechanism 22, and then transferred to transition mechanism 56 of third processing block G3 of processing station 3. Herein, support wafer S is transferred while its non-bonding surface SN is directed toward a lower side.

Next, support wafer S is transferred to remover applying device 42 by wafer transfer mechanism 61. Then, in remover applying device 42, remover R is applied to bonding surface SJ of support wafer S (step A7 in FIG. 27). Also, this step A7 is the same as the step A1 as described above, and thus its description will be omitted.

Next, support wafer S is transferred to heat processing device 43 by wafer transfer mechanism 61. Then, in heat processing device 43, support wafer S is heated up to a predetermined temperature, for example, 170° C. (step A8 in FIG. 27). Through such heating, remover R on support wafer S is heated and hardened so as to form releasing film R on support wafer S. Also, this step A8 is the same as the step A2 as described above, and thus its description will be omitted.

Next, support wafer S is transferred to bonding device 30 by wafer transfer mechanism 61. Support wafer S transferred to bonding device 30 is delivered from wafer transfer mechanism 61 to delivery arm 120 of delivery section 110, and then delivered from delivery arm 120 to wafer supporting pins 121. Then, support wafer S is transferred from wafer supporting pins 121 to inversion section 111 by first transfer arm 170 of transfer section 112.

Support wafer S transferred to inversion section 111 is held by holding members 151, and moved to position control mechanism 160. Then, in position control mechanism 160, the position of a notch of support wafer S is adjusted so as to adjust the position of the horizontal direction of support wafer S (step A9 in FIG. 27). Support wafer S of which the position of the horizontal direction has been adjusted is moved from position control mechanism 160 in the horizontal direction, and moved upward in the perpendicular direction, and its front and rear surfaces are inversed (step A10 in FIG. 27). In other words, bonding surface SJ of support wafer S is toward a lower side.

Next, support wafer S is moved downward in the perpendicular direction, and is transferred to bonding section 113 from inversion section 111 by second transfer arm 171 of transfer section 112. Herein, since second transfer arm 171 holds only the outer circumferential portion of bonding surface SJ of support wafer S, bonding surface SJ may not be polluted by, for example, particles attached on second transfer arm 171. Support wafer S transferred to bonding section 113 is adsorbed to be held by second holding part 201 (step A11 in FIG. 27). In second holding part 201, support wafer S is held while bonding surface SJ of support wafer S is toward a lower side, in other words, remover R is toward a lower side.

In bonding device 30, when wafer W and support wafer S are held by first holding part 200 and second holding part 201, respectively, the position of the horizontal direction of first holding part 200 is adjusted by moving mechanism 220 in such a manner that wafer W may face support wafer S, (step A12 in FIG. 27). Also, herein, the pressure between second holding part 201 and support wafer S is, for example, 0.1 atm (=0.01 MPa). Also, the pressure applied to the top surface of second holding part 201 is an atmospheric pressure, that is, 1.0 atm (=0.1 MPa). In order to maintain the atmospheric pressure applied to the top surface of second holding part 201, the pressure within pressure vessel 261 of compression mechanism 260 may be set as the atmospheric pressure, or a gap may be formed between the top surface of second holding part 201 and pressure vessel 261.

Figure 28:
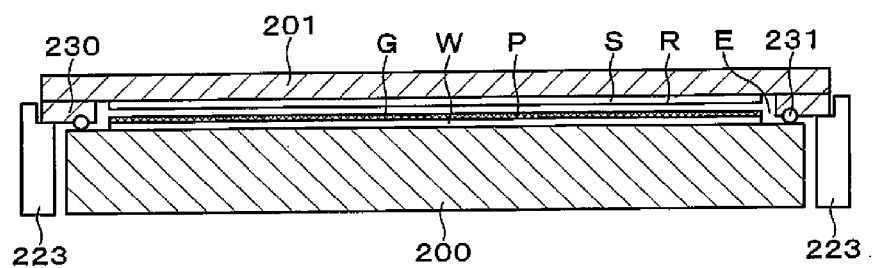
FIG. 28 is an explanatory view illustrating the state where a first holding part is raised.

Next, as illustrated in FIG. 28, first holding part 200 is raised by moving mechanism 220, and supporting members 223 extend to support second holding part 201. Herein, the height of supporting members 223 is adjusted so that the perpendicular directional distance of wafer W and support wafer S may be a predetermined distance (step A13 in FIG. 27). Also, the predetermined distance corresponds to a height where sealing material 231 is in contact with first holding part 200, and also the central portion of support wafer S comes in contact with wafer W when the central portion of second holding part 201 and support wafer S is bent as described below. In this manner, airtight bonding space E is formed between, first holding part 200 and second holding part 201.

Figure 29:
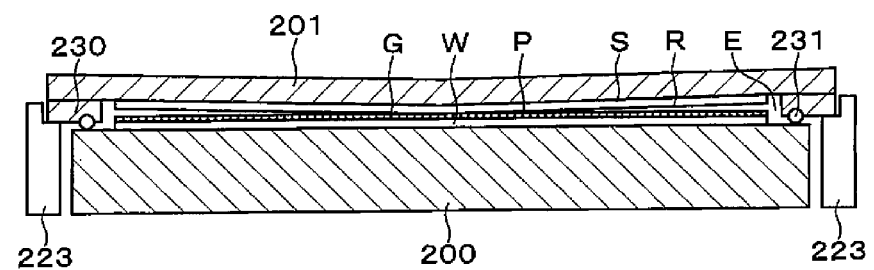
FIG. 29 is an explanatory view illustrating the state where the central portion of a second holding part is bent.

Next, the atmosphere of bonding space E is inhaled by inhale pipe 241. Then, when the pressure within bonding space E is decompressed to, for example, 0.3 atm (=0.03 MPa), a pressure difference between the pressure applied to the top surface of second holding part 201 and the pressure within bonding space E, that is, 0.7 atm (=0.07 MPa) is applied to second holding part 201. Thus, as illustrated in FIG. 29, the central portion of second holding part 201 is bent, and the central portion of support wafer S held by second holding part 201 is also bent. Also, although the pressure within bonding space E is decompressed to 0.3 atm (=0.03 MPa) as described above, support wafer S is continuously held by second holding part 201 because the pressure between second holding part 201 and support wafer S is 0.1 atm (=0.01 MPa).

Figure 30:
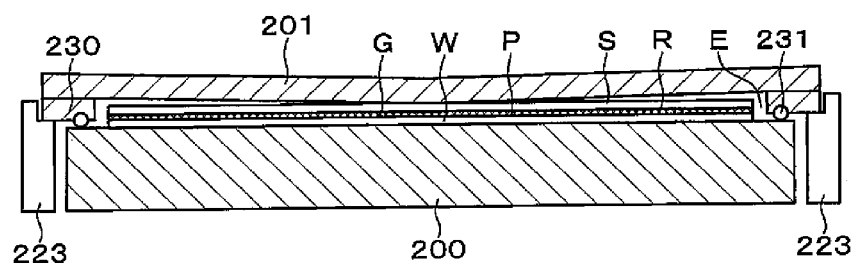
FIG. 30 is an explanatory view illustrating the state where a whole bonding surface of a support wafer is in contact with a whole bonding surface of a wafer.

Next, the atmosphere of bonding space E is further inhaled to decompress the inside of bonding space E. Then, when the pressure within bonding space E becomes less than 0.1 atm (=0.01 MPa), second holding part 201 is not able to hold support wafer S. Thus, as illustrated in FIG. 30, support wafer S drops downward, and thus the whole surface of bonding surface SJ of support wafer S comes in contact with the whole surface of bonding surface WJ of wafer W. Herein, support wafer S sequentially comes in contact with wafer W from a central portion where it is contact with wafer W toward the outside in the diametrical direction. In other words, even in a case where, for example, an air that may become a void exists within bonding space E, the air always exists at a position outer than a portion where support wafer S is in contact with wafer W. Thus, the air may be discharged from between wafer W and support wafer S. In this manner, the generation of a void is suppressed, while wafer W and support wafer S are bonded to each other by adhesive G (step A14 in FIG. 27).

Figure 31:
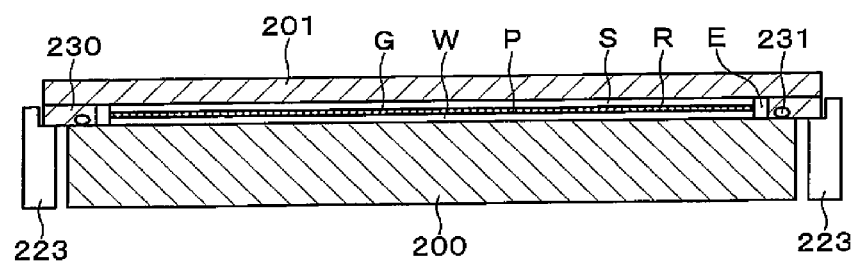
FIG. 31 is an explanatory view illustrating the state where a wafer and a support wafer are bonded to each other.

Next, as illustrated in FIG. 31, the bottom surface of second holding part 201 is in contact with non-bonding surface SN of support wafer S by adjusting the height of supporting members 223. Herein, sealing material 231 is elastically deformed so as to tightly attach first holding part 200 to second holding part 201. Then, wafer W and support wafer S are heated up to a predetermined temperature, for example, 200° C. by heating devices 211 and 242 while second holding part 201 is pressed downward at a predetermined pressure, for example, 0.5 MPa by compression mechanism 260. In this manner, wafer W and support wafer S are more strongly attached and bonded (step A15 in FIG. 27).

Bonded wafer T including wafer W bonded to support wafer S is transferred from bonding section 113 to delivery section 110 by first transfer arm 170 of transfer section 112. Bonded wafer T transferred to delivery section 110 is delivered to delivery arm 120 through wafer supporting pins 121, and further delivered from delivery arm 120 to wafer transfer mechanism 61.

Next, bonded wafer T is transferred to heat processing device 43 by wafer transfer mechanism 61. Then, in heat processing device 43, the temperature of bonded wafer T is controlled to a predetermined temperature, for example, a room temperature (23° C.). Then, bonded wafer T is transferred to transition mechanism 58 by wafer transfer mechanism 61, and then transferred to cassette CT of predetermined cassette loading plate 11 by wafer transfer mechanism 22 of loading/unloading station 2. In this manner, a series of bonding processing of wafer W to support wafer S are completed.

In the above described exemplary embodiment, protective agent P is applied to wafer W by protective agent applying device 41, wafer W applied with protective agent P is heated up to a predetermined temperature by heat processing device 43, an adhesive is applied to wafer W by adhesive applying device 40, and wafer W applied with the adhesive is heated up to a predetermined temperature by heat processing device 43. Also, remover R is applied to support wafer S by remover applying device 42, and support wafer S applied with remover R is heated up to a predetermined temperature by heat processing device 43. Then, in bonding device 30, through adhesive G, protective agent P and remover R, wafer W and support wafer S may be bonded to each other. As described above, in one bonding system 1, adhesive G, protective agent P and remover R may be applied between wafer W and support wafer S so as to bond wafer W to support wafer S. Also, in present bonding system 1, wafer W and support wafer S may be concurrently processed. Also, while wafer W and support wafer S are bonded to each other in bonding device 30, other wafers W and other support wafers S may be processed in adhesive applying device 40, protective agent applying device 41, remover applying device 42, heat processing device 43 and bonding device 30. Accordingly, the bonding of wafer W to support wafer S may be efficiently performed, thereby improving a throughput in a bonding processing.

Also, in bonding system 1, since adhesive G, protective agent P and remover R are applied through individual devices 40, 41 and 42, respectively, it is possible to appropriately apply adhesive G, protective agent P and remover R to wafer W or support wafer S.

Also, adhesive applying device 40, protective agent applying device 41 and remover applying device 42 are disposed to be layered in this order in the perpendicular direction from the lower side. In other words, they are disposed in a viscosity order of liquids (adhesive G, protective agent P and remover R) to be supplied to wafer W or support wafer S. Herein, it is possible to appropriately waste liquids from devices 40, 41, and 42 toward the lower side because a high viscosity waste liquid that is hard to flow has a short outflow distance, and a low viscosity waste liquid that is easy to flow has a long outflow distance.

Figure 32:
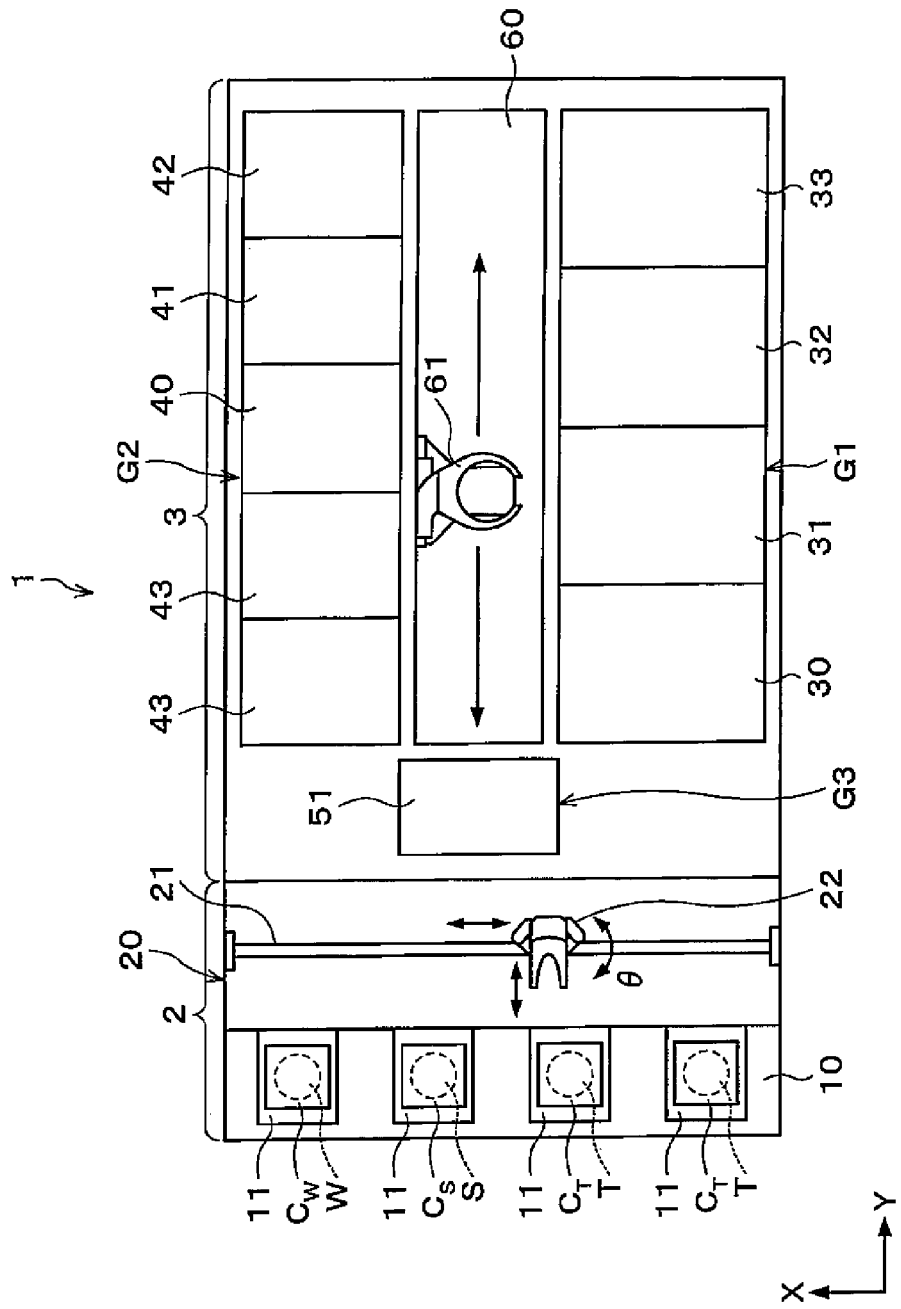
FIG. 32 is a plan view schematically illustrating the configuration of a bonding system according to another exemplary embodiment.
Figure 33:
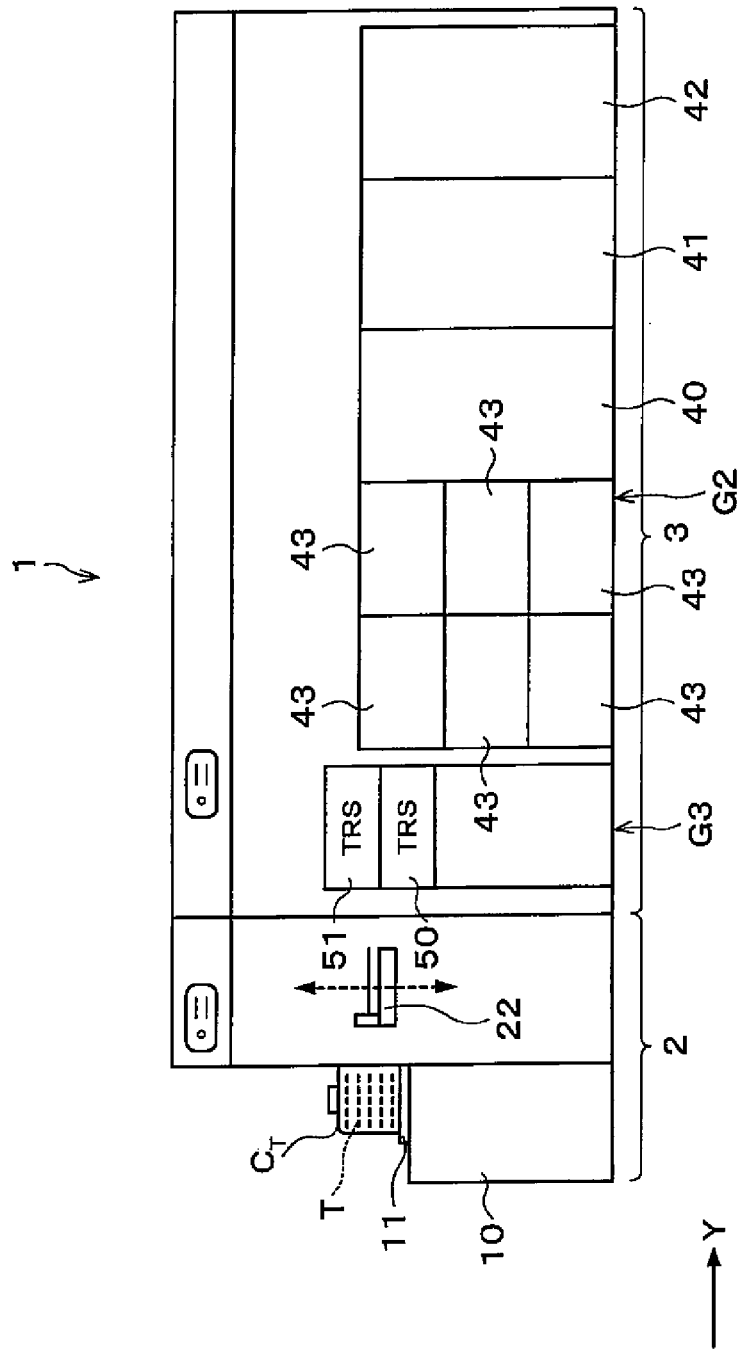
FIG. 33 is a side view schematically illustrating the inner configuration of the bonding system according to another exemplary embodiment.

In bonding system 1 according to the above-described exemplary embodiment, adhesive applying device 40, protective agent applying device 41 and remover applying device 42 are layered in the perpendicular direction. However, adhesive applying device 40, protective agent applying device 41 and remover applying device 42 may be disposed side by side when viewed from a plan view as illustrated in FIGS. 32 and 33. Adhesive applying device 40, protective agent applying device 41 and remover applying device 42 are disposed in this order in the Y direction from the side of loading/unloading station 2. Also, for example, in third processing block G3, transition mechanisms 50 and 51 may be provided, and wafer transfer mechanism 70 may be omitted. The present exemplary embodiment may show the same effect as that in the above described exemplary embodiment. In other words, the bonding of wafer W to support wafer S may be efficiently performed, thereby improving a throughput in a bonding processing.

Figure 34:
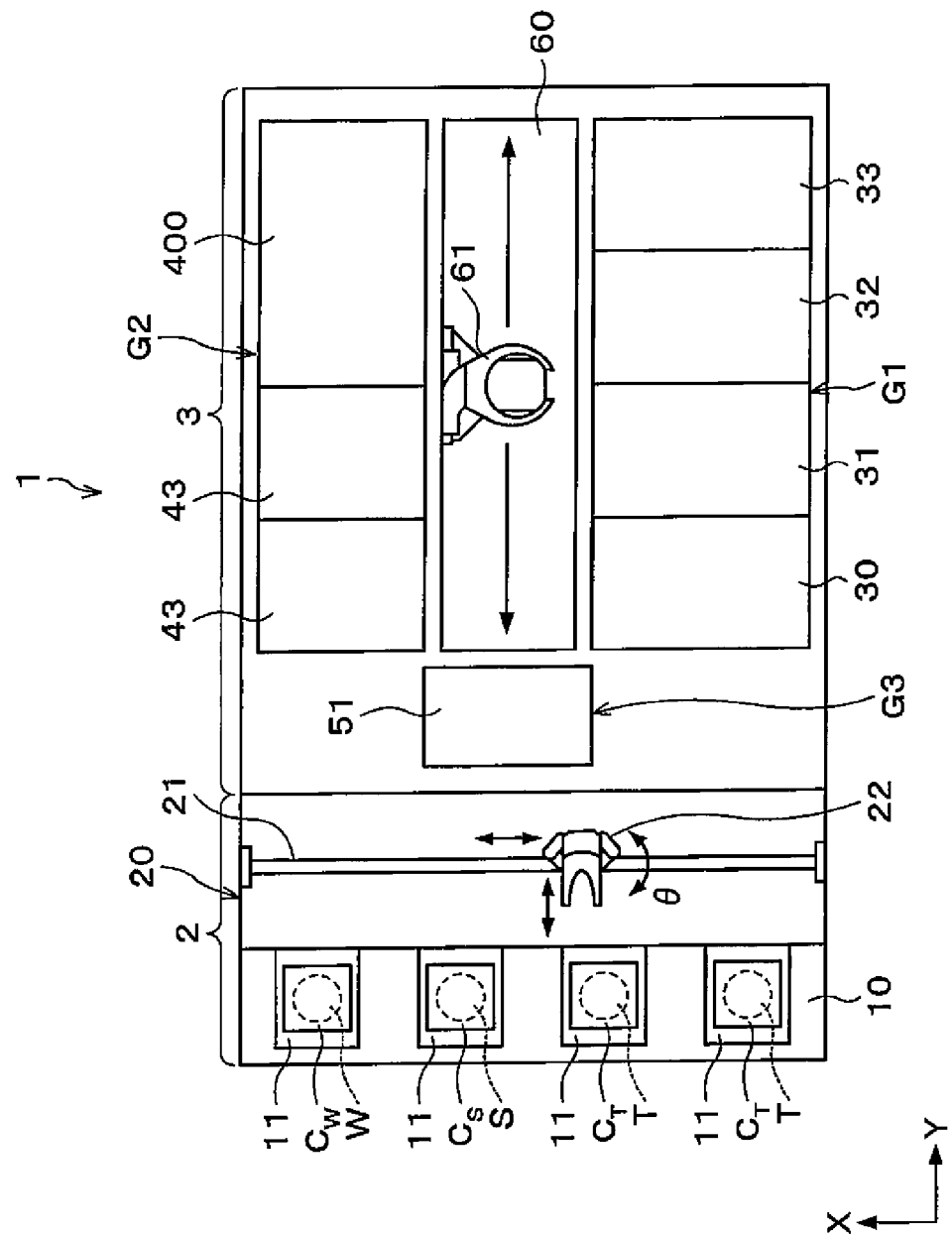
FIG. 34 is a plan view schematically illustrating the configuration of a bonding system according to a further exemplary embodiment.
Figure 35:
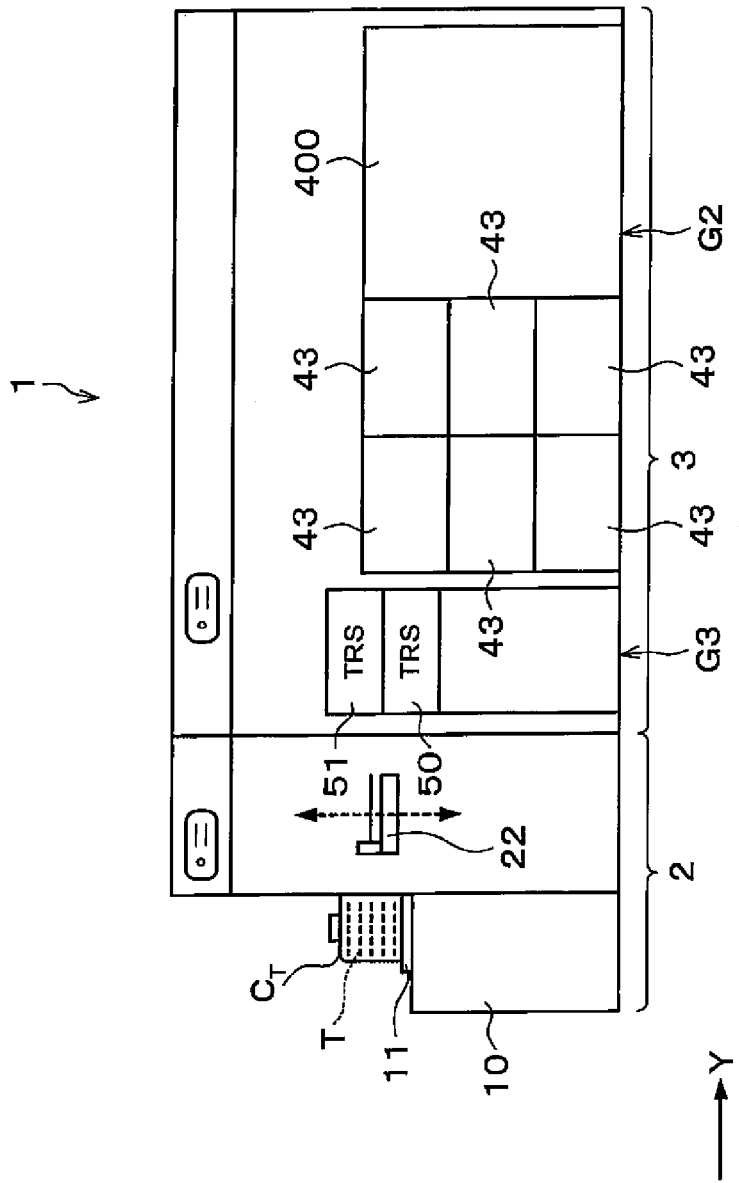
FIG. 35 is a side view schematically illustrating the inner configuration of the bonding system according to a further exemplary embodiment.

In the above described exemplary embodiments, adhesive G, protective agent P and remover R are applied to wafer W or support wafer S via individual devices 40, 41, and 42, respectively. However, adhesive G, protective agent P and remover R may be applied to wafer W or support wafer S via one device. As illustrated in FIGS. 34 and 35, bonding system 1 has an application device 400 instead of adhesive applying device 40, protective agent applying device 41 and remover applying device 42. In this case, for example, in third processing block G3, transition mechanisms 50 and 51 may be provided, and wafer transfer mechanism 70 may be omitted.

Figure 36:
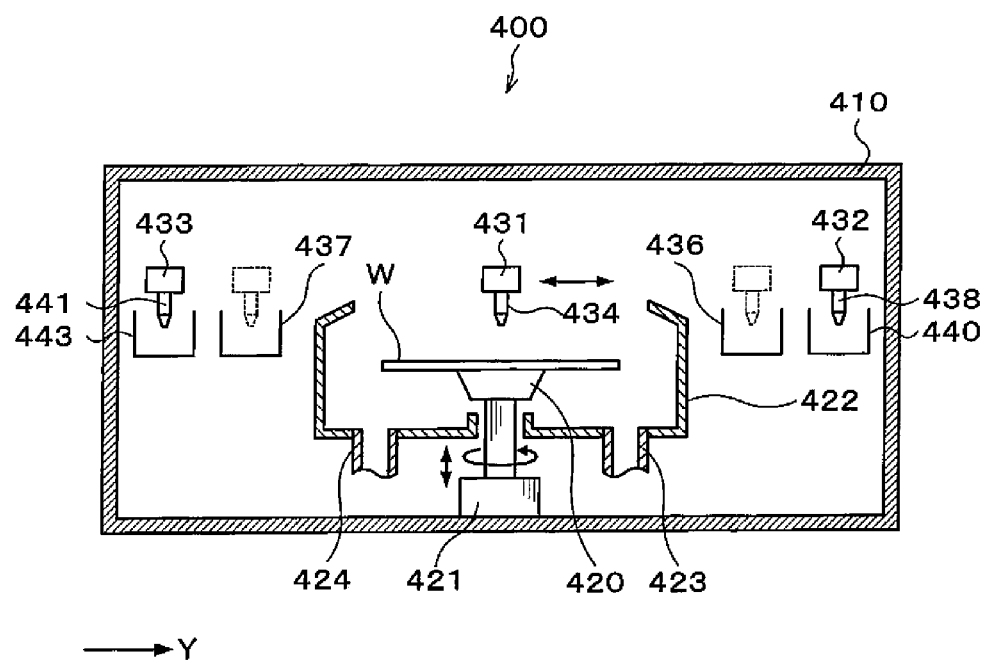
FIG. 36 is a vertical sectional view schematically illustrating the configuration of an application device according to a further exemplary embodiment.

Application device 400, as illustrated in FIG. 36, has a processing chamber 410 of which the inside may be airtight. A loading/unloading opening (not illustrated) of wafer W or support wafer S is formed in the lateral surface of processing chamber 410 at the side of wafer transfer area 60. In the loading/unloading opening, an open/close shutter (not illustrated) is provided. Also, in the description below, a case where a wafer to be accommodated in application device 400 is wafer W will be described.

A spin chuck 420 configured to hold and rotate wafer W is provided at the central portion within processing chamber 410. Spin chuck 420 has a horizontal top surface, and the top surface has, for example, a suction hole (not illustrated) configured to suck wafer W. Through the suction by the suction hole, wafer W may be adsorbed to be held on spin chuck 420.

A chuck driving part 421 provided with, for example, a motor is provided below spin chuck 420. Spin chuck 420 may be rotated at a predetermined speed by chuck driving part 421. Also, in chuck driving part 421, an elevating driving source, such as, for example, a cylinder, is provided, by which spin chuck 420 is able to raise and lower.

Around spin chuck 420, a cup 422 is provided which is configured to receive and collect a liquid scattered or dropped from wafer W. At the bottom surface of cup 422, a drain pipe 423 configured to discharge the collected liquid, and an exhaustion pipe 424 configured to evacuate and exhaust the atmosphere within cup 422 are connected.

Figure 37:
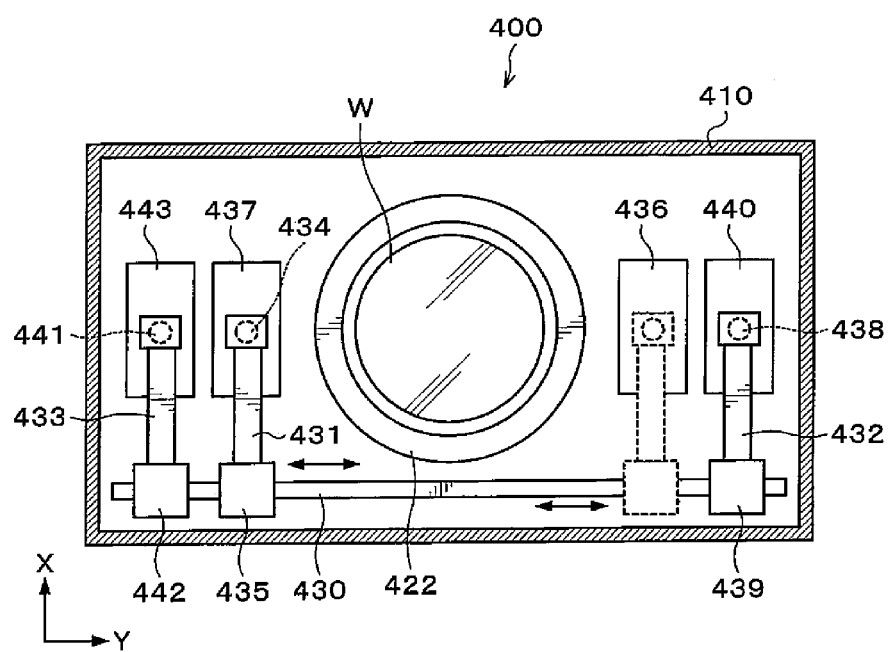
FIG. 37 is a cross sectional view schematically illustrating the configuration of an application device according to a further exemplary embodiment.

As illustrated in FIG. 37, a rail 430 that extends along the Y direction (the horizontal direction in FIG. 37) is formed at the minus X direction side of cup 422 (the downward direction in FIG. 37). Rail 430 is, for example, formed from the outside at the minus Y direction side (the left side in FIG. 37) of cup 422 to the outside at the plus Y direction side (the right side in FIG. 37). For example, three arms 431, 432, and 433 are attached to rail 430.

As illustrated in FIGS. 36 and 37, an adhesive nozzle 434, as an adhesive supply part, configured to supply adhesive G is supported by first arm 431. First arm 431 is able to move on rail 430 by a nozzle driving part 435 illustrated in FIG. 37. Thus, adhesive nozzle 434 is able to move to a stand-by portion 437 provided at the outside at the minus Y direction side of cup 422 via a position above the central portion of wafer W within cup 422 from a stand-by portion 436 provided at the outside at the plus Y direction side of cup 422. Also, first arm 431 may be raised and lowered by nozzle driving part 435, thereby adjusting the height of adhesive nozzle 434.

A protective agent nozzle 438, as a protective agent supply part, configured to supply protective agent P is supported by second arm 432. Second arm 432 is able to move on rail 430 by a nozzle driving part 439 illustrated in FIG. 37. Thus, protective agent nozzle 438 may move from a stand-by portion 440 provided at the outside at the plus Y direction side of cup 422 to a position above the central portion of wafer W within cup 422. Stand-by portion 440 is provided at the plus Y direction side of stand-by portion 436. Also, second arm 432 may be raised and lowered by nozzle driving part 439, thereby adjusting the height of protective agent nozzle 438.

A remover nozzle 441, as a remover supply part, configured to supply remover R is supported by third arm 433. Third arm 433 is able to move on rail 430 by a nozzle driving part 442 illustrated in FIG. 37. Thus, remover nozzle 441 may move from a stand-by portion 443 provided at the outside at the minus Y direction side of cup 422 to a position above the central portion of support wafer S within cup 422. Stand-by portion 443 is provided at the minus Y direction side of stand-by portion 437. Also, third arm 433 may be raised and lowered by nozzle driving part 442, thereby adjusting the height of remover nozzle 441.

In such a case, in application device 400, adhesive G may be applied on wafer W by adhesive nozzle 434, protective agent P may be applied on wafer W by protective agent nozzle 438, and remover R may be applied on support wafer S by remover nozzle 441.

The present exemplary embodiment may show the same effect as that in the above described exemplary embodiments. In other words, the bonding of wafer W to support wafer S may be efficiently performed, thereby improving a throughput in a bonding processing. Further, since three devices 40, 41 and 42 may be included in one application device 400, the device configuration of bonding system 1 may be simplified.

Figure 38:
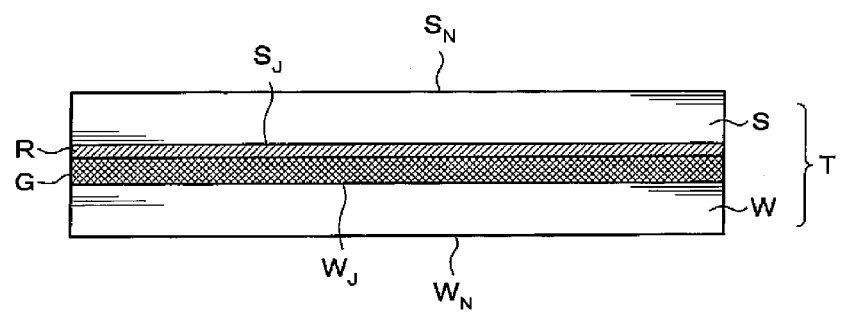
FIG. 38 is a side view illustrating a wafer and a support wafer, according to another exemplary embodiment.

In the above described exemplary embodiments, wafer W and support wafer S are bonded to each other through adhesive G, protective agent P and remover R. However, protective agent P may be omitted according to the kind of a device formed on wafer W, especially, bumps B, or the kind of adhesive G. In such a case, as illustrated in FIG. 38, adhesive G and remover R are provided between wafer W and support wafer S. Adhesive G is provided at the side of wafer W, and remover R is provided at the side of support wafer S.

Figure 39:
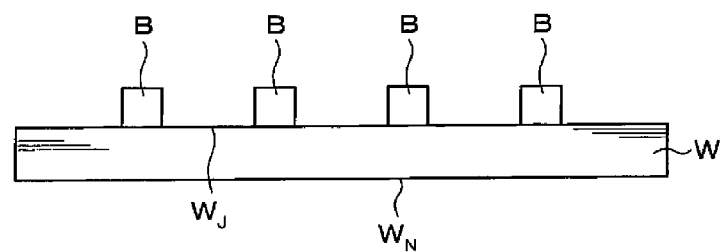
FIG. 39 is an explanatory view illustrating bumps formed on a wafer, according to another exemplary embodiment.

Hereinafter, a case where protective agent P can be omitted will be described. As illustrated in FIG. 39, a plurality of bumps B are formed on bonding surface WJ of wafer W. When bumps B are formed in, for example, a cylindrical shape, there is no gap between bumps B and bonding surface WJ unlike the case where bumps B are formed in a spherical shape as illustrated in FIG. 4. Then, although adhesive G has a high viscosity, bubbles do not remain between bumps B and bonding surface WJ. Also, although bumps B are not formed in a cylindrical shape, bubbles do not remain in the gap between bumps B and bonding surface WJ according to the kind of adhesive G. In such a case, protective agent P with a low viscosity may be omitted.

Figure 40:
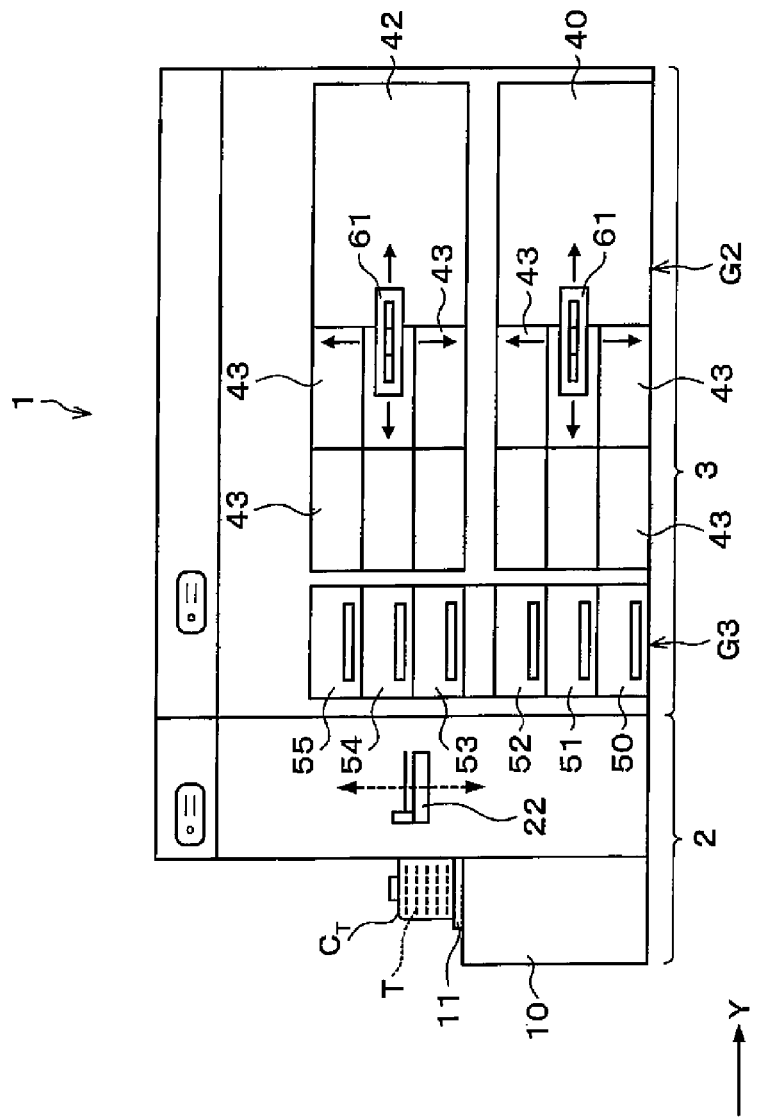
FIG. 40 is a side view schematically illustrating the inner configuration of a bonding system according to a still further exemplary embodiment.

In this case, as illustrated in FIG. 40, in second processing block G2 of bonding system 1, protective agent applying device 41 according to the above described exemplary embodiments is omitted, and adhesive applying device 40 configured to apply adhesive G on wafer W, and remover applying device 42 configured to apply remover R on support wafer S are disposed to be layered in this order in the perpendicular direction from the lower side.

Figure 41:
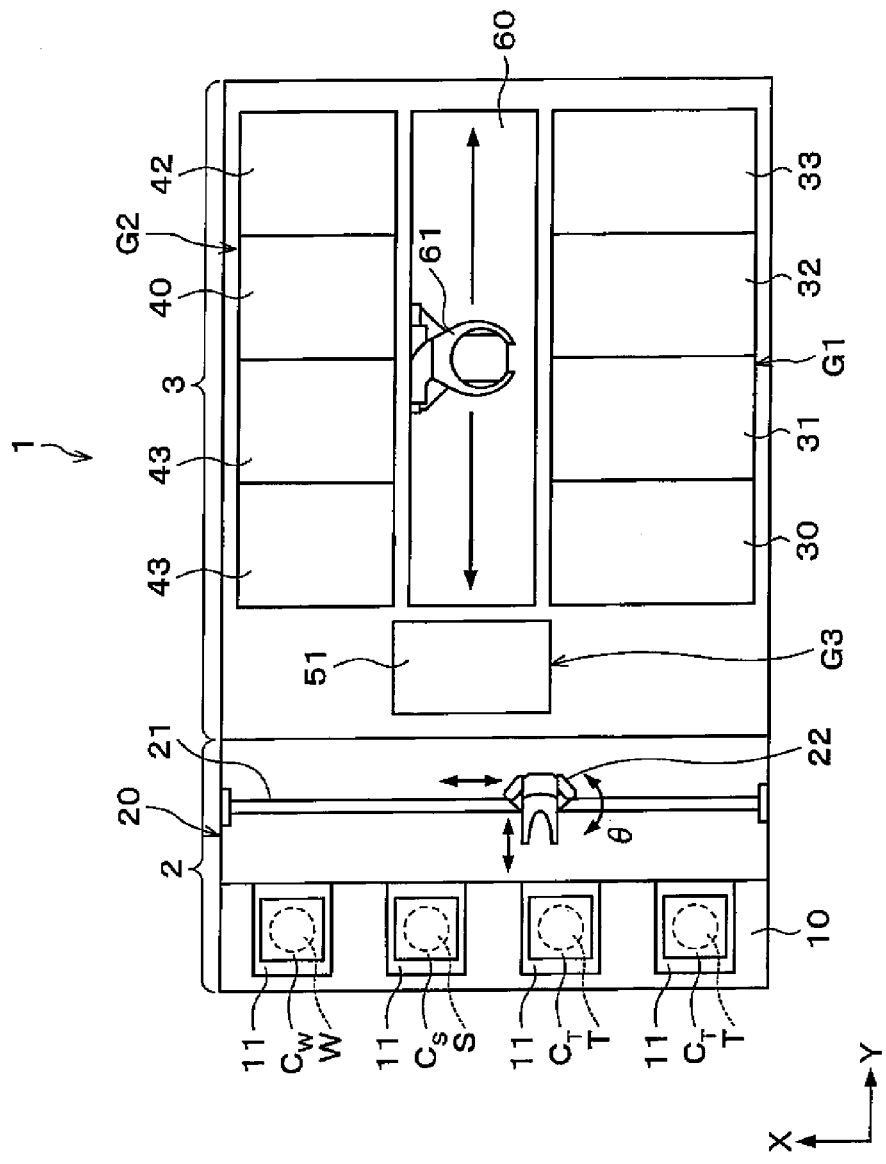
FIG. 41 is a plan view schematically illustrating the configuration of a bonding system according to a still yet further exemplary embodiment.

Also, as illustrated in FIG. 41, adhesive applying device 40 and remover applying device 42 may be disposed side by side when viewed from a plan view. Adhesive applying device 40 and remover applying device 42 are disposed in this order in the Y direction from the side of loading/unloading station 2.

Otherwise, adhesive G and remover R may be applied to wafer W and support wafer S, respectively, by one application device 400 as described above. In such a case, in application device 400, adhesive nozzle 434 and remover nozzle 441 are provided, but protective agent nozzle 438 and its associated parts are omitted.

In any case, in bonding system 1, adhesive G is applied on wafer W, and wafer W applied with adhesive G is heated, and remover R is applied on support wafer S, and support wafer S applied with remover R is heated, and then wafer W and support wafer S may be bonded to each other through adhesive G and remover R. Accordingly, the bonding of wafer W to support wafer S may be efficiently performed, thereby improving a throughput in a bonding processing. Also, since other configurations in bonding system 1 or processing on wafer W or support wafer S in respective devices of bonding system 1 are the same as those in the above exemplary embodiments, their description will be omitted.

Meanwhile, various kinds of adhesives G have been recently developed. Thus, in some case according to the kind of adhesive G, after wafer W and support wafer S are bonded to each other, a further heat processing may be required to improve the adhesive strength of adhesive G.

Figure 42:
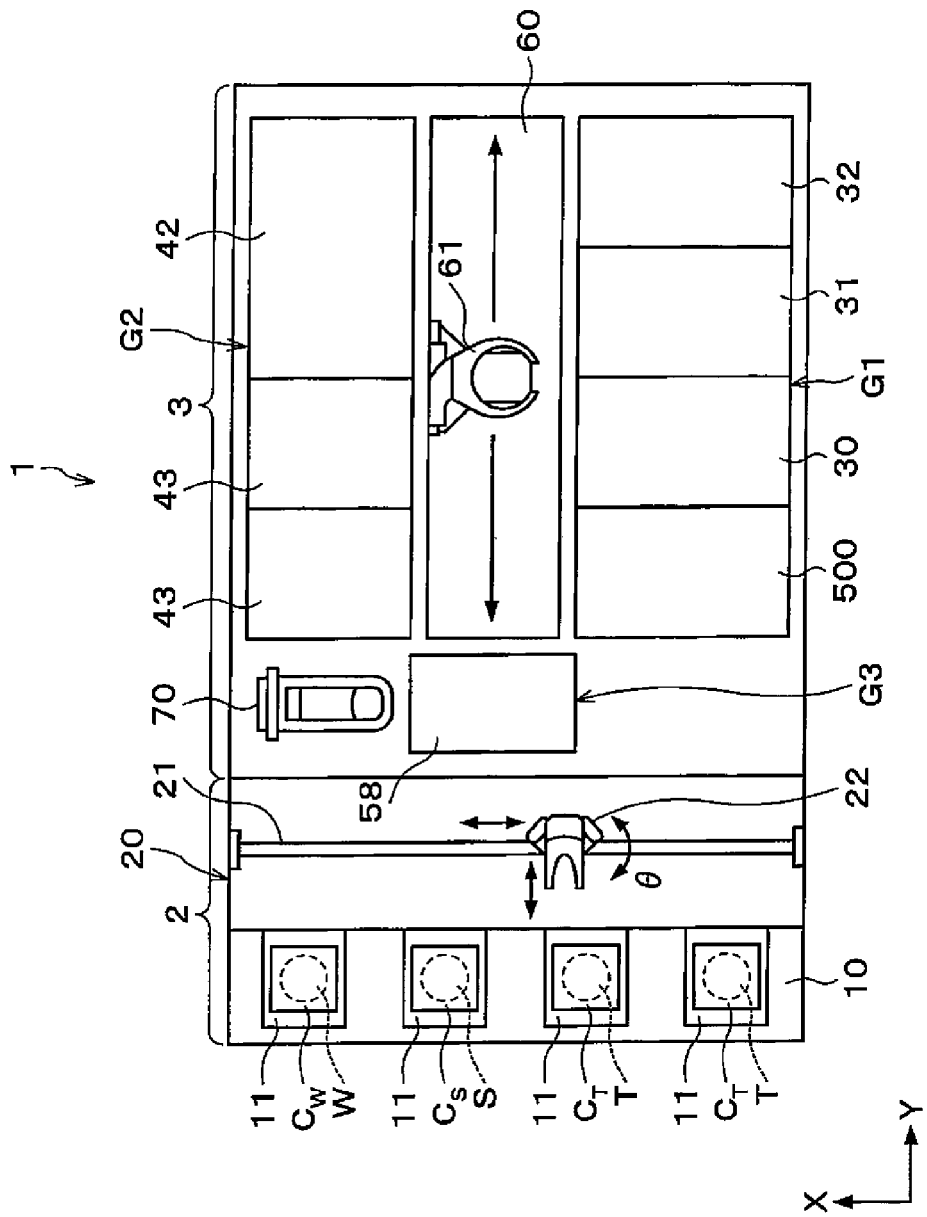
FIG. 42 is a plan view schematically illustrating the configuration of a bonding system according to a still yet another exemplary embodiment.

Therefore, as illustrated in FIG. 42, in bonding system 1 according to the above described exemplary embodiments, another heat processing device 500 configured to perform a heat processing on bonded wafer T may be additionally provided. For example, heat processing device 500 is disposed at a position closer to the side of loading/unloading station 2 as compared to bonding device 30, in second processing block G2. Also, in the present exemplary embodiment, in heat processing device 500, the outer circumferential portion of bonded wafer T is subjected to a heat processing. Herein, the outer circumferential portion of bonded wafer T means, for example, a portion ranging from the outer periphery of bonded wafer T to 2 mm to 5 mm. Also, the central portion of bonded wafer T means a portion of a range inside the outer circumferential portion of bonded wafer T.

Figure 43:
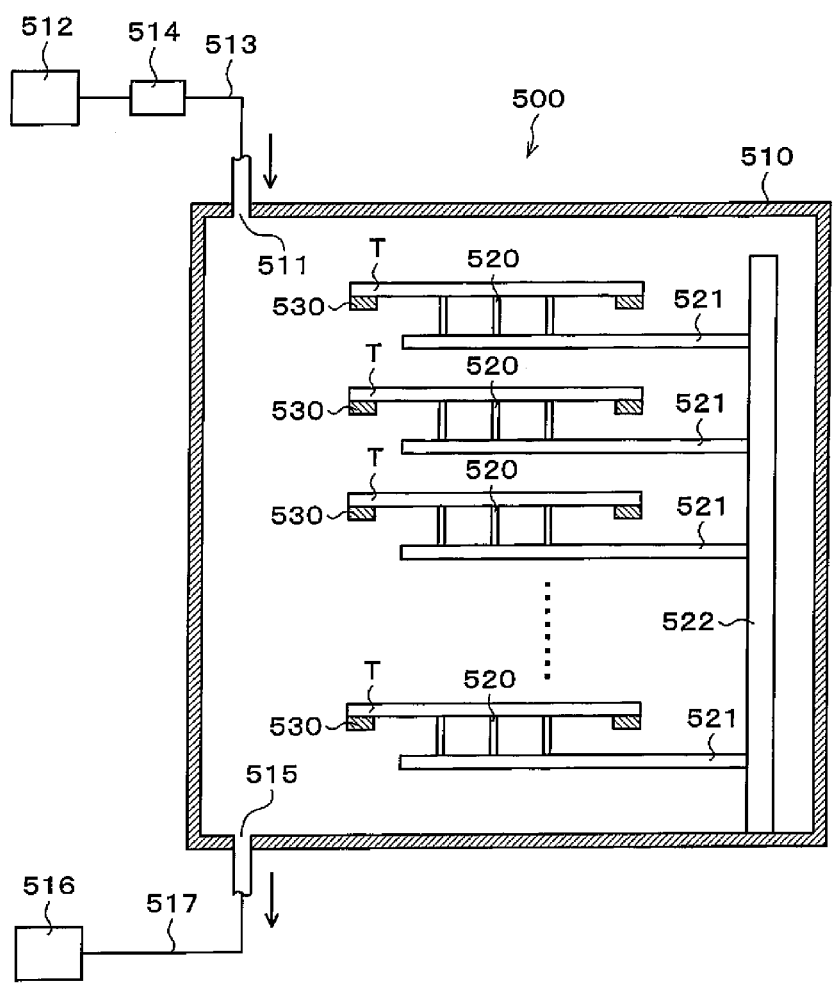
FIG. 43 is a vertical sectional view schematically illustrating the configuration of a heat processing device.

As illustrated in FIG. 43, heat processing device 500 has a processing chamber 510 of which the inside may be closed. In the lateral surface of processing chamber 510 at the side of wafer transfer area 60, a loading/unloading opening (not illustrated) of bonded wafer T is formed, and the loading/unloading opening is provided with an open/close shutter (not illustrated).

At the ceiling surface of processing chamber 510, a gas supply hole 511 configured to supply an inert gas such as, for example, a nitrogen gas, into processing chamber 510 is formed. Gas supply hole 511 is connected to a gas supply tube 513 communicating with a gas supply source 512. Also, gas supply tube 513 is provided with a supply device group 514 including, for example, a valve or a flow control part for controlling the flow of the inert gas.

At the bottom surface of processing chamber 510, an inhale hole 515 configured to inhale the atmosphere within processing chamber 510 is formed. Inhale hole 515 is connected to an inhale pipe 517 communicating with a negative pressure generator 516 such as, for example, a vacuum pump.

Supporting pins 520 configured to support bonded wafer T at a predetermined position are provided within processing chamber 510. Supporting pins 520 are supported by a supporting column 522 extending in the perpendicular direction, via a supporting member 521. Then, supporting pins 520 and supporting member 521 are provided to be layered in plural numbers in the perpendicular direction, and a plurality of bonded wafers T may be accommodated and subjected to a heat processing within processing chamber 510.

Figure 44:
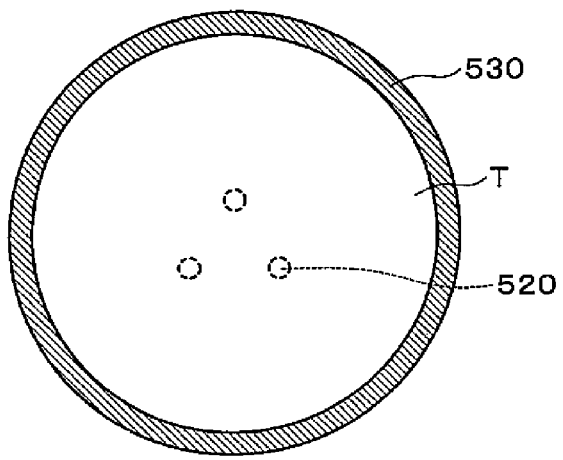
FIG. 44 is a plan view schematically illustrating the configuration of a heating device.

Also, within processing chamber 510, a plurality of heating devices 530 are provided, which are configured to heat the outer circumferential portion of bonded wafers T supported by supporting pins 520 up to a predetermined temperature. As heating device 530, for example, a heater is used. As illustrated in FIG. 44, heating device 530 is formed in an annular shape when viewed from the plan view. Heating device 530 is provided to be supported by a supporting member (not illustrated) within processing chamber 510.

Also, within processing chamber 510, a temperature control mechanism (not illustrated) may be provided, which is configured to control the temperature of bonded wafer T having been heated by heating device 530, to a predetermined temperature, for example, a room temperature (23° C.).

In this case, bonded wafer T that has been bonded by bonding device 30 in step A15 is transferred to heat processing device 500 by wafer transfer mechanism 61. Herein, the inside of heat processing device 500 is maintained under an inert gas atmosphere. Bonded wafer T transferred to heat processing device 500 is delivered from wafer transfer mechanism 61 to supporting pins 520. Subsequently, the outer circumferential portion of bonded wafer T supported by supporting pins 520 is heated up to, for example, 190° C. by heating device 530. In other words, the outer circumferential portion of bonded wafer T is subjected to a heat processing at a higher temperature than the central portion by heating device 530. Such heating improves the adhesive strength of adhesive G at the outer circumferential portion of bonded wafer T, and thus bonded wafer T may be appropriately bonded.

In the present exemplary embodiment, after wafer W and support wafer S are bonded to each other by bonding device 30, and then the outer circumferential portion of bonded wafer T may be subjected to a heat processing at a higher temperature than the central portion by heat processing device 500. Through such a heat processing, adhesive G at the outer circumferential portion of bonded wafer T is subjected to a heat processing at an appropriate temperature, for example, 190° C., and thus, the adhesive strength of adhesive G may be appropriately maintained. Accordingly, wafer W and support wafer S may be appropriately bonded to each other. For this reason, a predetermined processing may be appropriately performed in a state where wafer W and support wafer S are bonded to each other.

Herein, when such a heat processing on bonded wafer T is performed on the whole surface of adhesive G, wafer W and support wafer S are strongly fixed. In such a case, after the performance of a predetermined processing such as, for example, a polishing processing, on wafer W in a state where wafer W and support wafer S are bonded to each other, when wafer W is released form support wafer S, it is impossible to appropriately perform the release. Also, since a high force is required to release wafer W from support wafer S, there is a possibility that a device formed on wafer W may be damaged.

In this regard, in the present exemplary embodiment, since the central portion of bonded wafer T is subjected to a heat processing at a lower temperature than the outer circumferential portion, the adhesive strength of adhesive G at the central portion of bonded wafer T is not improved. Thus, after the performance of a predetermined processing in a state where wafer W and support wafer S are bonded to each other, when wafer W is released form support wafer S, it is impossible to easily perform the release. Also, since wafer W may be easily released from support wafer S, it is possible to suppress a device formed on wafer W from being damaged.

Also, even in a case where a long time is required for a heat processing of bonded wafer T according to the kind of adhesive G, a plurality of bonded wafers T may be accommodated and subjected to heat processing in heat processing device 500. Accordingly, a bonding processing of wafer W and support wafer S may be performed without reducing a throughput.

Also, since the inside of heat processing device 500 may be maintained under an inert gas atmosphere, it is possible to suppress an oxide film from being formed on bonded wafer T, that is, wafer W. Thus, a heat processing of bonded wafer T may be appropriately performed.

Figure 45:
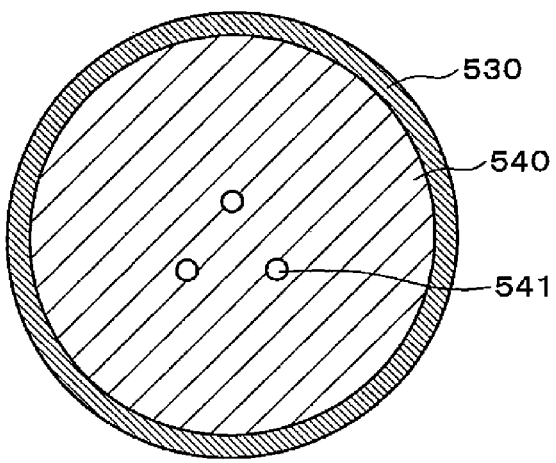
FIG. 45 is a plan view schematically illustrating the configuration of a heating device and a temperature control device according to another exemplary embodiment.

Also, as illustrated in FIG. 45, in heat processing device 500 according to the above described exemplary embodiment, a temperature control device 540 configured to control the temperature of the central portion of bonded wafer T to a predetermined temperature may be provided at the inside of heating device 530. Within temperature control device 540, a temperature control member (not illustrated) such as, for example, a Peltier element is embedded. Also, in the vicinity of the central portion of temperature control device 540, through holes 541 are penetrated to be formed in the thickness direction, through which supporting pins 520 are inserted.

In such a case, in heat processing device 500, the outer circumferential portion of bonded wafer T is heated up to a predetermined temperature, for example, 190° C., by heating device 530, and the temperature of the central portion of bonded wafer T is controlled to a predetermined temperature, for example, 23° C., by temperature control device 540. Accordingly, it is possible to appropriately improve the adhesive strength of adhesive G at the outer circumferential portion of bonded wafer T, and at the same time to more certainly suppress the adhesive strength of adhesive G at the central portion of bonded wafer T from being increased. Thus, wafer W and support wafer S are appropriately bonded to each other so that a following processing may be appropriately performed. Further, when wafer W is released from support wafer S, the release may be more easily performed.

Herein, as described above, the heating temperature of the outer circumferential portion of bonded wafer T is set as 190° C. in order to suppress the heating from causing a damage to a device formed on the central portion of bonded wafer T. In this regard, in the present exemplary embodiment, since the temperature of the central portion of bonded wafer T may be positively controlled to a temperature that does not cause a damage to the device, by temperature control device 540 the heating temperature of bonded wafer T's outer circumferential portion not formed with the device may be set as a temperature higher than 190° C. In this case, the throughput in the bonding processing of wafer W and support wafer S may be further improved.

Figure 46:
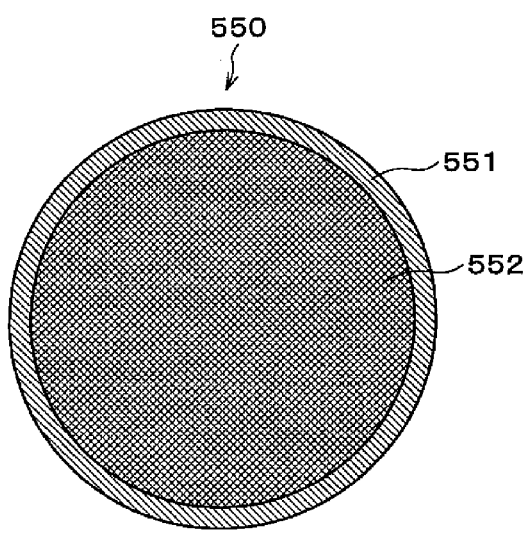
FIG. 46 is a plan view schematically illustrating the configuration of a heat processing plate according to a further exemplary embodiment.

In heat processing device 500 according to the above described exemplary embodiment, annular heating device 530 may be provided, and temperature control device 540 is provided within heating device 530. However, instead of heating device 530, or temperature control device 540, as illustrated in FIG. 46, a heat processing plate 550 on which bonded wafer T is disposed and heated may be provided. Heat processing plate 550 may be supported by, for example, supporting member 521, and supporting pins 520 may be omitted.

Heat processing plate 550 is divided into an outer circumferential area 551 configured to heat the outer circumferential portion of bonded wafer T, and a central area 552 that is provided at the inside of outer circumferential area 551, and is configured to heat the central portion of bonded wafer T. Within outer circumferential area 551 and central area 552, respective individual heaters (not illustrated) are embedded, so as to heat outer circumferential area 551 and central area 552, respectively.

In such a case, in heat processing device 500, the outer circumferential portion of bonded wafer T is heated by outer circumferential area 551 of heat processing plate 550 at a higher temperature than the heating temperature of the central portion of bonded wafer T by central area 552. Then, the outer circumferential portion of bonded wafer T is heated up to a predetermined temperature, for example, 190° C. by outer circumferential area 551, and the central portion of bonded wafer T is heated up to a temperature lower than 190° C. by central area 552. Accordingly, it is possible to appropriately improve the adhesive strength of adhesive G at the outer circumferential portion of bonded wafer T, and at the same time to more certainly suppress the adhesive strength of adhesive G at the central portion of bonded wafer T from being increased. Thus, wafer W and support wafer S are appropriately bonded to each other so that a following processing may be appropriately performed. Further, when wafer W is released from support wafer S, the release may be more easily performed.

Also, in bonding system 1 according to the above described exemplary embodiment, heat processing device 500 configured to perform a heat processing on bonded wafer T that has been subjected to bonding by bonding device 30 is additionally provided. However, heat processing device 43 that is configured to perform a heat processing on wafer W or support wafer S may be used to perform a heat processing on bonded wafer T. In this case, instead of heating plate 320 of heat processing device 43, heat processing plate 550 as above is used.

In the above described exemplary embodiments, in bonding device 30, wafer W and support wafer S are bonded to each other in a state where wafer W is disposed at a lower side, and support wafer S is disposed at an upper side. However, the upper/lower disposition of wafer W and support wafer S may be inversed.

Figure 47:
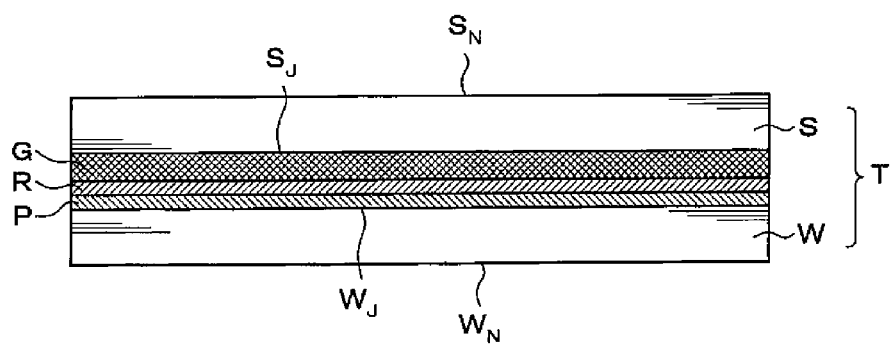
FIG. 47 is a side view illustrating a wafer and a support wafer according to a further exemplary embodiment.

In the above described exemplary embodiment, in step A3, adhesive G is applied on wafer W. However, adhesive G may be applied on support wafer S. Otherwise, adhesive G may be applied on both of wafer W and support wafer S. Also, in the above described exemplary embodiment, in step A7, remover R is applied on support wafer S. However, remover R may be applied on wafer W. Also, when adhesive G is applied on support wafer S, and remover R is applied on wafer W, protective agent P, remover R, and adhesive G are provided to be layered in this order from the side of wafer W, between wafer W and support wafer S, as illustrated in FIG. 47.

In the above described exemplary embodiment, in step A4, wafer W applied with adhesive G is heated up to a predetermined temperature ranging from 100° C. to 300° C. However, a heat processing of wafer W may be performed by two steps. For example, wafer W may be heated at a first heat processing temperature, for example, 100° C. to 150° C. in heat processing device 43, and then heated at a second heat processing temperature, for example, 150° C. to 300° C. in another heat processing device 43. In such a case, heating mechanisms in heat processing device 43 and another heat processing device 43 may have their own fixed temperatures, respectively. Accordingly, there is no need to adjust the temperatures of the heating mechanisms, and thus it is possible to further improve the throughput in a bonding processing of wafer W and support wafer S.

Hereinafter, another exemplary embodiment will be described. Herein, the description on the same components as those in the above described exemplary embodiment will be omitted.

Figure 48:
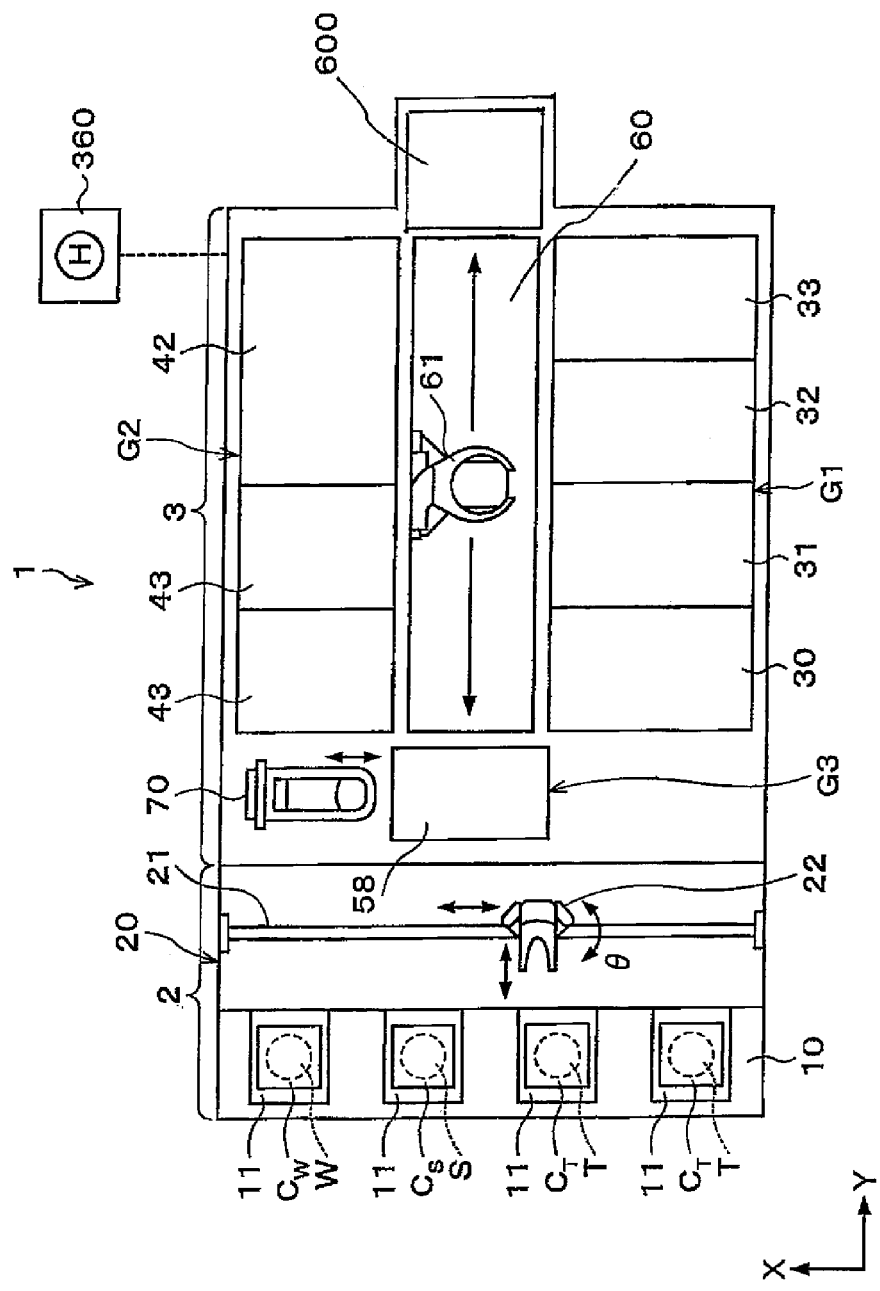
FIG. 48 is a plan view schematically illustrating the configuration of a bonding system according to a still yet further another exemplary embodiment.

FIG. 48 is a plan view schematically illustrating the configuration of bonding system 1 according to the present exemplary embodiment. In the present exemplary embodiment, bonding system 1 has a periphery removal device 600 configured to remove a protective agent, an adhesive, and a remover attached on the peripheral portion (bevel) of wafer W or support wafer S. Periphery removal device 600 is disposed at the lateral side of wafer transfer area 60. Wafer W or support wafer S is carried in or carried out to/from periphery removal device 600 by using wafer transfer mechanism 61.

Figure 49:
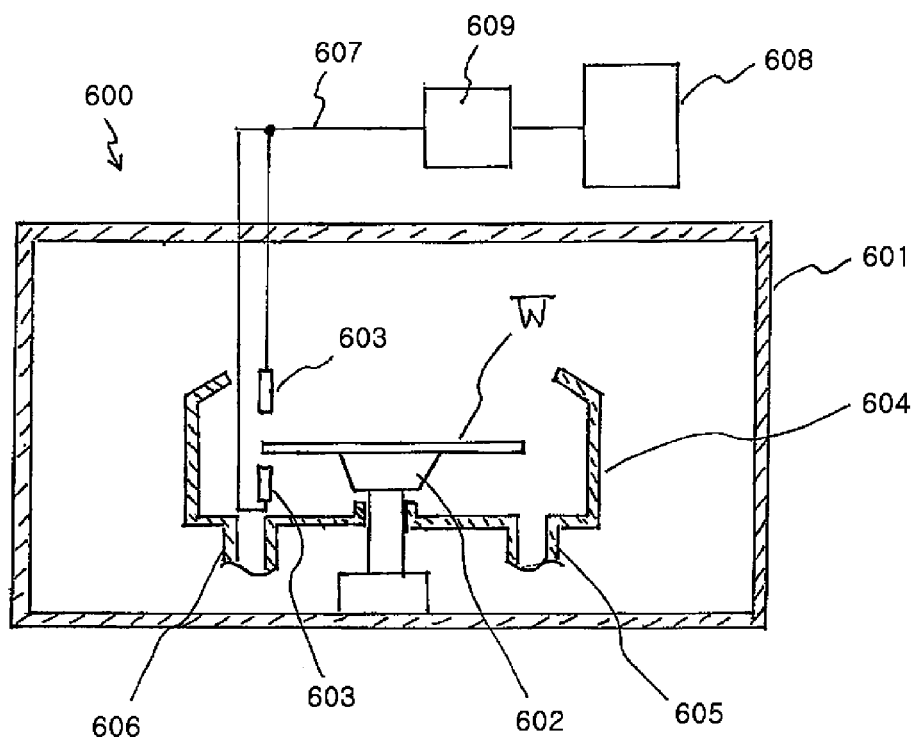
FIG. 49 is a vertical sectional view schematically illustrating the configuration of a periphery removal device.

FIG. 49 is a vertical sectional view schematically illustrating the configuration of periphery removal device 600. Periphery removal device 600 has a processing chamber 601 of which inside may be airtight. A loading/unloading opening (not illustrated) of wafer W or support wafer S is formed in the lateral surface of processing chamber 601, and in the loading/unloading opening, an open/close shutter (not illustrated) is provided.

At the central portion within processing chamber 601, a spin chuck 602 configured to hold and rotate wafer W or support wafer S, and a cleaning nozzle 603 configured to supply a cleaning liquid to the peripheral portion of the front/rear surfaces of held wafer W or support wafer S held by spin chuck 602 are provided. Around spin chuck 602, a cup 604 is provided which is configured to collect the cleaning liquid. At the bottom surface of cup 604, a drain pipe 605 configured to discharge the collected cleaning liquid, and an exhaustion pipe 606 configured to exhaust the atmosphere within cup 604 are connected.

Cleaning nozzle 603 is connected to a supply tube 607 configured to supply the cleaning liquid. Supply tube 607 is communicated with a cleaning liquid supply source 608. Supply tube 607 is provided with a supply device group 609 configured to control the flow of the cleaning liquid.

Figure 50:
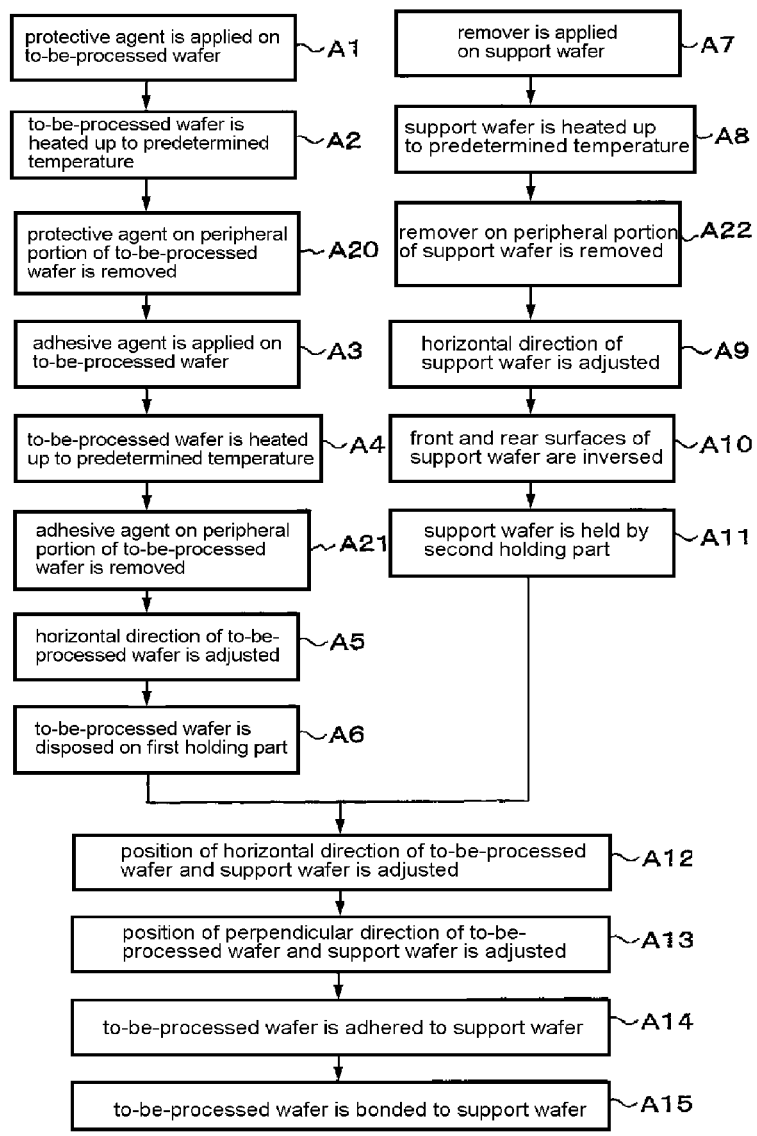
FIG. 50 is a flow chart illustrating an example of a main process of a cleaning method using the periphery removal device.

Hereinafter, a cleaning method using periphery removal device 600 will be described. FIG. 50 is a flow chart illustrating an example of a main process.

As illustrated in FIG. 50, when the step A2 is completed, wafer W is transferred to periphery removal device 600. Wafer W is held and rotated by spin chuck 602. Herein, a cleaning liquid is supplied to the peripheral portion of the front/rear surfaces of wafer W from cleaning nozzle 603 so as to perform cleaning on the periphery of wafer W. Then, a protective agent attached on the peripheral portion of the front/rear surfaces of wafer W is removed (step A20).

After the step A20, wafer W is transferred to adhesive applying device 40, and subjected to the above described processing in the step A3.

After the step A4, wafer W is transferred to periphery removal device 600, and the peripheral portion of the front/rear surfaces of wafer W is cleaned in the same manner as described above so as to remove the adhesive attached on the peripheral portion of the front/rear surfaces of wafer W (step A21).

After the step A8, support wafer S is transferred to periphery removal device 600, and the peripheral portion of the front/rear surfaces of support wafer S is cleaned in the same manner as described above so as to remove the remover attached on the peripheral portion of the front/rear surfaces of support wafer S (step A22).

In this manner, wafer W and support wafer S may be bonded to each other in a state where the protective agent, the adhesive, and the remover have been removed from the peripheral portions of the front/rear surfaces of wafer W and support wafer S. Thus, it becomes possible to appropriately bond wafer W to support wafer S.

Also, periphery removal device 600 is not limited to the above described configuration as long as it is able to remove a protective agent, an adhesive, and a remover from the peripheral portions of the front/rear surfaces of wafer W and support wafer S. Also, the configuration of periphery removal device 600 is not limited to a wet processing using a cleaning liquid. For example, the configuration may be used for a dry processing using laser or plasma in order to remove a protective agent, an adhesive, and a remover from the peripheral portions of the front/rear surfaces of wafer W and support wafer S. Also, instead of periphery removal device 600, a removal processing device (not illustrated) configured to perform cleaning on the periphery in the same manner as in periphery removal device 600 may be provided within, for example, another processing device (heat processing device 43) or heat processing device 500 so as to perform cleaning on the periphery.

Also, in the above described exemplary embodiments, a film of protective agent P is formed on wafer W, and a film of adhesive G is formed thereon. However, when adhesive G is applied, there may be a possibility that the film of protective agent P formed on wafer W is eluted. Thus, only the film of protective agent P may be formed on wafer W, the film of remover R and the film of adhesive G may be sequentially formed on support wafer S, and then wafer W and support wafer S may be bonded to each other. In this manner, the film of protective agent P formed on wafer W may be suppressed from being eluted, thereby certainly protecting bumps B.

As above, exemplary embodiments according to the present disclosure have been described with reference to drawings. However, the present disclosure is not limited to the exemplary embodiments. It is apparent to the person skilled in the art that various alternative or modified embodiments may be made within the scope of the spirit of in claims. Naturally, it is appreciated that these embodiments are within the technical scope of the present disclosure. Further, the present disclosure is not limited to these embodiments, and may be embodied in various aspects. Besides a wafer as a substrate, the present disclosure may applied to other substrates such as a mask reticle for FPD (flat panel display), or a photo mask.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A bonding system configured to bond a substrate to be processed to a support substrate, comprising:
    a processing station configured to perform a series of predetermined processing on the substrate and the support substrate, and
    a loading/unloading station configured to load or unload the substrate, the support substrate, or a bonded substrate comprising the substrate bonded to the support substrate to/from the processing station,
    wherein the processing station comprises:
        an adhesive supply part configured to apply an adhesive to the substrate or the support substrate;
        a protective agent supply part configured to apply a protective agent to the substrate so that the protective agent is applied to a side of the substrate rather than to the adhesive, between the substrate and the support substrate;
        a remover supply part configured to apply a remover to the substrate or the support substrate so that the remover is applied to a side of the support substrate rather than to the adhesive, between the substrate and the support substrate;
        a heat processing device configured to heat the substrate or the support substrate which is applied with at least the adhesive, the protective agent or the remover, at a predetermined temperature;
        a bonding device configured to bond the substrate to the support substrate through the adhesive, the protective agent and the remover;
        a transfer area configured to transfer the substrate, the support substrate or the bonded substrate to/from the adhesive supply part, the protective agent supply part, the remover supply part, the heat processing device and the bonding device; and
        another heat processing device configured to perform a heat processing on the bonded substrate bonded by the bonding device, so that an outer circumferential portion of the bonded substrate is subjected to the heat processing at a higher temperature than a central portion.

2. The bonding system of claim 1, wherein the processing station comprises:
    an adhesive applying device provided with the adhesive supply part;
    a protective agent applying device provided with the protective agent supply part; and
    a remover applying device provided with the remover supply part.

3. The bonding system of claim 2, wherein the adhesive applying device, the protective agent applying device and the remover applying device are disposed to be layered in a perpendicular direction.

4. The bonding system of claim 2, wherein the adhesive applying device, the protective agent applying device and the remover applying device are disposed side by side when viewed from a plan view.

5. The bonding system of claim 1, wherein the processing station comprises an applying device provided with the adhesive supply part, the protective agent supply part and the remover supply part.

6. A bonding system configured to bond a substrate to be processed to a support substrate, comprising:
    a processing station configured to perform a series of predetermined processing on the substrate and the support substrate; and
    a loading/unloading station configured to load or unload the substrate, the support substrate, or a bonded substrate comprising the substrate bonded to the support substrate, to/from the processing station,
    wherein the processing station comprises:
        an adhesive supply part configured to apply an adhesive to the substrate or the support substrate;
        a remover supply part configured to apply a remover to the substrate or the support substrate so that the remover is applied to a side of the support substrate rather than to the adhesive, between the substrate and the support substrate;
        a heat processing device configured to heat the substrate or the support substrate which is applied with at least the adhesive, or the remover, at a predetermined temperature,
        a bonding device configured to bond the substrate to the support substrate through the adhesive, and the remover;
        a transfer area configured to transfer the substrate, the support substrate or the bonded substrate to/from the adhesive supply part, the remover supply part, the heat processing device and the bonding device; and
        another heat processing device configured to perform a heat processing on the bonded substrate bonded by the bonding device, so that an outer circumferential portion of the bonded substrate is subjected to the heat processing at a higher temperature than a central portion.

7. The bonding system of claim 6, wherein the processing station comprises:
    an adhesive applying device provided with the adhesive supply part; and
    a remover applying device provided with the remover supply part.

8. The bonding system of claim 7, wherein the adhesive applying device and the remover applying device are disposed to be layered in a perpendicular direction.

9. The bonding system of claim 7, wherein the adhesive applying device and the remover applying device are disposed side by side when viewed from a plan view.

10. The bonding system of claim 6, wherein the processing station comprises an applying device provided with the adhesive supply part and the remover supply part.

11. The bonding system of claim 6, wherein the another heat processing device comprises an annular heating device configured to heat the outer circumferential portion of the bonded substrate.

12. The bonding system of claim 11, wherein the another heat processing device comprises a temperature control device that is provided within the heating device and controls the central portion of the bonded substrate to a predetermined temperature.

13. The bonding system of claim 6, wherein the another heat processing device comprises a heat processing plate on which the bonded substrate is disposed and heated,
- wherein the heat processing plate is divided into an outer circumferential area configured to heat the outer circumferential portion of the bonded substrate, and a central area that is provided at inside of the outer circumferential area, and is configured to heat the central portion of the bonded substrate, and
- the outer circumferential area is heated at a higher temperature than the central area.

14. The bonding system of claim 6, wherein the another heat processing device is capable of accommodating a plurality of the bonded substrates and performing the heat processing on the plurality of the bonded substrates.

15. The bonding system of claim 6, wherein inside of the another heat processing device is capable of being maintained under an inert gas atmosphere.

16. A method of bonding a substrate to be processed to a support substrate by using a bonding system,
- wherein the bonding system comprises:
- a processing station; and
- a loading/unloading station configured to load or unload the substrate, the support substrate, or a bonded substrate comprising the substrate bonded to the support substrate to/from the processing station,
- wherein the processing station comprises:
- an adhesive supply part configured to apply an adhesive to the substrate or the support substrate,
- a remover supply part configured to apply a remover to the substrate or the support substrate so that the remover is applied to a side of the support substrate rather than to the adhesive, between the substrate and the support substrate,
- a heat processing device configured to heat the substrate or the support substrate which is applied with at least the adhesive or the remover, at a predetermined temperature,
- a bonding device configured to bond the substrate to the support substrate through the adhesive and the remover, and
- a transfer area configured to transfer the substrate, the support substrate or the bonded substrate to/from the adhesive supply part, the remover supply part, the heat processing device and the bonding device, wherein the method comprises:
- an adhesive applying step of applying the adhesive from the adhesive supply part to the substrate or the support substrate, and heating the substrate or the support substrate to a predetermined temperature by the heat processing device;
- a remover applying step of applying the remover from the remover supply part to the substrate or the support substrate, and heating the substrate or the support substrate to a predetermined temperature by the heat processing device;
- a bonding step of bonding the substrate to the support substrate through the adhesive and the remover in the bonding device; and
- a heat processing step of heating the substrate bonded at the boding step in another heat processing device provided to the processing station so that an outer circumferential portion of the bonded substrate is subjected to the heat processing at a higher temperature than a central portion.

17. The method of claim 16, wherein the processing station comprises an adhesive applying device provided with the adhesive supply part, and a remover applying device provided with the remover supply part,
- in the adhesive applying step, the adhesive applying device applies the adhesive to the substrate or the support substrate, and then the heat processing device heats the substrate or the support substrate to the predetermined temperature, and
- in the remover applying step, the remover applying device applies the remover to the substrate or the support substrate, and then the heat processing device heats the substrate or the support substrate to the predetermined temperature.

18. The method of claim 16, wherein the processing station comprises an applying device provided with the adhesive supply part, and the remover supply part,
- in the adhesive applying step, the applying device applies the adhesive to the substrate or the support substrate, and the heat processing device heats the substrate or the support substrate to the predetermined temperature, and
- in the remover applying step, the applying device applies the remover to the substrate or the support substrate, and the heat processing device heats the substrate or the support substrate to the predetermined temperature.

* * * * *